United States Patent
Hu et al.

(10) Patent No.: US 11,736,688 B2
(45) Date of Patent: Aug. 22, 2023

(54) ADAPTIVE LOOP FILTER SIGNALLING

(71) Applicant: QUALCOMM Incorporated, San Diego, CA (US)

(72) Inventors: Nan Hu, San Diego, CA (US); Hilmi Enes Egilmez, San Diego, CA (US); Vadim Seregin, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 219 days.

(21) Appl. No.: 16/905,502

(22) Filed: Jun. 18, 2020

(65) Prior Publication Data

US 2020/0404263 A1 Dec. 24, 2020

Related U.S. Application Data

(60) Provisional application No. 62/864,888, filed on Jun. 21, 2019.

(51) Int. Cl.
| | |
|---|---|
| *H04N 19/117* | (2014.01) |
| *H04N 19/46* | (2014.01) |
| *H03M 7/30* | (2006.01) |
| *H03M 7/40* | (2006.01) |
| *H04N 19/176* | (2014.01) |

(52) U.S. Cl.
CPC ........ *H04N 19/117* (2014.11); *H03M 7/4075* (2013.01); *H03M 7/6011* (2013.01); *H04N 19/176* (2014.11); *H04N 19/46* (2014.11)

(58) Field of Classification Search
None
See application file for complete search history.

(56) References Cited

U.S. PATENT DOCUMENTS

| | | | | |
|---|---|---|---|---|
| 2009/0262955 A1* | 10/2009 | Kimura | .............. | H04N 21/4852 381/107 |
| 2012/0140815 A1* | 6/2012 | Zhou | .................... | H04N 19/184 375/240.03 |
| 2019/0028717 A1 | 1/2019 | Budagavi | | |
| 2020/0236656 A1* | 7/2020 | Cao | ........................ | H04W 80/02 |
| 2021/0127115 A1* | 4/2021 | Esenlik | .................. | H04N 19/82 |
| 2021/0368171 A1* | 11/2021 | Zhang | .................. | H04N 19/184 |

OTHER PUBLICATIONS

Su Y-C., et al., "CE2.2.1 and CE2.2.2: ALF Coefficient Coding and Range Constraints", JVET-L0082-v2, Joint Video Experts Team (JVET) of ITU-T SG 16 WP 3 and ISO/IEC JTC 1/SC 29/WG 11, 12th Meeting: Macao, CN, Oct. 3-12, 2018, 7 pages.

* cited by examiner

*Primary Examiner* — Xiaolan Xu
(74) *Attorney, Agent, or Firm* — Procopio, Cory, Hargreaves & Savitch

(57) ABSTRACT

Example techniques are described for coding video data by obtaining a block of video data, obtaining an adaptive parameter set, determining a set of adaptive loop filter parameters for a plurality of filters for the block of video data based on the adaptive parameter set, wherein a plurality of adaptive loop parameters of the set of adaptive loop filter parameters are signaled using the same signaling parameter for each of the plurality of filters of the adaptive parameter set, and coding the block of video data using the set of adaptive loop filter parameters. The example techniques can be performed as part of an encoding or decoding process and/or by an encoder or a decoder.

19 Claims, 10 Drawing Sheets

Diagonal

Vertical Flip

Rotation

ADAPTIVE LOOP FILTER SIGNALLING

This application claims the benefit of U.S. Provisional Patent Application 62/864,888, filed on Jun. 21, 2019, the entire content of which is hereby incorporated by reference.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video coding techniques, such as those described in the standards defined by MPEG-2, MPEG-4, ITU-T H.263, ITU-T H.264/MPEG-4, Part 10, Advanced Video Coding (AVC), ITU-T H.265/High Efficiency Video Coding (HEVC), and extensions of such standards. The video devices may transmit, receive, encode, decode, and/or store digital video information more efficiently by implementing such video coding techniques.

Video coding techniques may include filtering techniques that can enhance the quality of a decoded video signal. The filtering techniques can be applied post-filter, where filtered frames are not used for prediction of future frames, and/or can be applied in-loop, where the filtered frames are available to be used to predict future frames.

SUMMARY

In general, the techniques of this disclosure are related to improvements to filtering techniques in video coding. More specifically, the techniques are related to improvements to Adaptive Loop Filter (ALF) signaling.

Methods, devices, apparatus, and computer-readable media for coding video data are described herein. The methods can include obtaining a block of video data, obtaining an adaptive parameter set, determining, using a processor, a set of adaptive loop filter parameters for a plurality of filters for the block of video data based on the adaptive parameter set, wherein a plurality of adaptive loop parameters of the set of adaptive loop filter parameters are signaled using the same signaling parameter for each of the plurality of filters of the adaptive parameter set, and coding the block of video data using the set of adaptive loop filter parameters.

In some embodiments, the plurality of adaptive loop parameters can include filter coefficients that are signaled using the same signaling parameter for each of the plurality of filters.

In further embodiments, the plurality of adaptive loop parameters can include filter coefficient positions that are signaled using the same signaling parameter for each of the plurality of filters.

In additional embodiments, the same signaling parameter can be an exponential-Golomb code order, the order can be a $0^{th}$ order, the order can be signaled, the order can be a default value (e.g., determined to be a default value based on a flag or based on not being signaled), and the like.

In some embodiments, the plurality of filters can include all of the filters signaled in the adaptive parameter set.

In additional embodiments, filter information from the adaptive parameter set can be used to form one or more new adaptive parameter sets.

In additional embodiments, the coding is in-loop coding.

In further embodiments, the coded block of video data is used for prediction of future frames of the video data.

In some embodiments, the coding is post-processing.

The device can be any type of computing device, such as a wireless communication device, and can include a memory configured to store video data and one or more processors configured to perform a method that includes obtaining a block of video data, obtaining an adaptive parameter set, determining a set of adaptive loop filter parameters for a plurality of filters for the block of video data based on the adaptive parameter set, wherein a plurality of adaptive loop parameters of the set of adaptive loop filter parameters are signaled using the same signaling parameter for each of the plurality of filters of the adaptive parameter set, and coding the block of video data using the set of adaptive loop filter parameters.

The non-transitory computer-readable medium can be for storing a program containing instructions that, when executed by a processor of a device, cause the device to perform a method that includes obtaining a block of video data, obtaining an adaptive parameter set, determining a set of adaptive loop filter parameters for a plurality of filters for the block of video data based on the adaptive parameter set, wherein a plurality of adaptive loop parameters of the set of adaptive loop filter parameters are signaled using the same signaling parameter for each of the plurality of filters of the adaptive parameter set, and coding the block of video data using the set of adaptive loop filter parameters.

The apparatus can include means for obtaining a block of video data, means for obtaining an adaptive parameter set, means for determining a set of adaptive loop filter parameters for a plurality of filters for the block of video data based on the adaptive parameter set, wherein a plurality of adaptive loop parameters of the set of adaptive loop filter parameters are signaled using the same signaling parameter for each of the plurality of filters of the adaptive parameter set, and means for coding the block of video data using the set of adaptive loop filter parameters.

The details of one or more examples of the disclosure are set forth in the accompanying drawings and the description below. Other features, objects, and advantages will be apparent from the description, drawings, and claims.

DETAILED DESCRIPTION

In general, the techniques of this disclosure are related to improvements to Adaptive Loop Filter (ALF) signalling.

The techniques of this disclosure may be applied to any existing video codec, such as those conforming to ITU-T H.264/AVC (Advanced Video Coding) or High Efficiency Video Coding (HEVC), also referred to as ITU-T H.265. H.264 is described in International Telecommunication Union, "Advanced video coding for generic audiovisual services," SERIES H: AUDIOVISUAL AND MULTIMEDIA SYSTEMS, Infrastructure of audiovisual services—Coding of moving video, H.264, June 2011, and H.265 is described in International Telecommunication Union, "High efficiency video coding," SERIES H: AUDIOVISUAL AND MULTIMEDIA SYSTEMS, Infrastructure of audiovisual services—Coding of moving video, April 2015. The techniques of this disclosure may also be applied to any other previous, current, or future video coding standards as an efficient coding tool.

Other video coding standards include ITU-T H.261, ISO/IEC MPEG-1 Visual, ITU-T H.262 or ISO/IEC MPEG-2 Visual, ITU-T H.263, ISO/IEC MPEG-4 Visual and the Scalable Video Coding (SVC) and Multiview Video Coding (MVC) extensions of H.264, as well as the extensions of HEVC, such as the range extension, multiview extension (MV-HEVC) and scalable extension (SHVC).

There currently exists a need for standardization of video coding technology with a compression capability that exceeds that of the HEVC standard (including its current extensions).

Certain techniques of this disclosure may be described with reference to H.264 and/or HEVC to aid in understanding, but the techniques described are not limited to H.264 or HEVC and can be used in conjunction with other coding standards and other coding tools.

Figure 1:
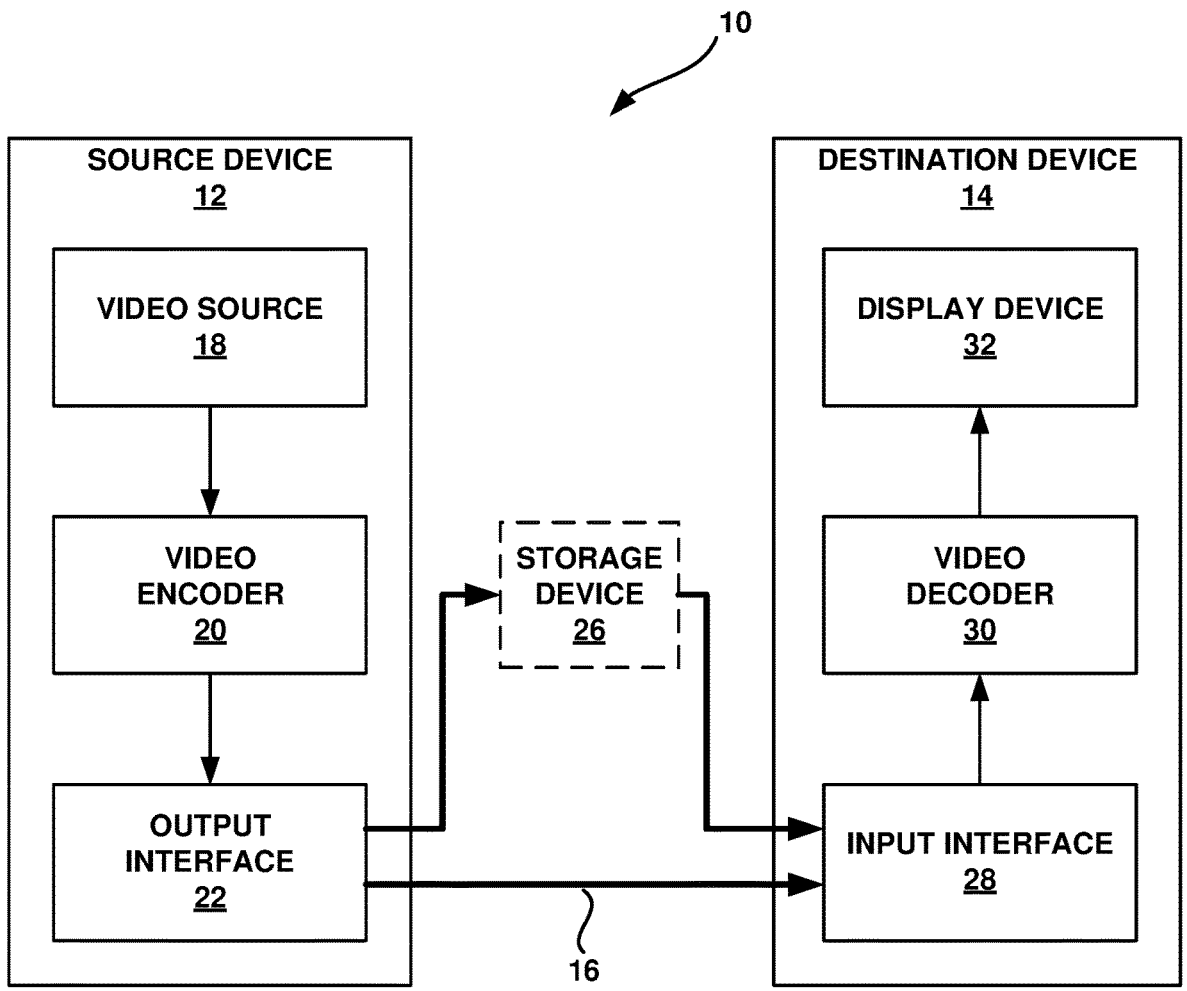
FIG. 1 is a block diagram illustrating an example video encoding and decoding system that may utilize the techniques described in this disclosure.

FIG. 1 is a block diagram illustrating an example video encoding and decoding system 10 that may utilize the techniques for adaptive loop filtering signaling described in this disclosure. As shown in FIG. 1, system 10 includes a source device 12 that generates encoded video data to be decoded at a later time by a destination device 14. Source device 12 and destination device 14 may be any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, head-mounted displays (HMDs), wearable technology devices (e.g., so-called "smart" watches), or the like. In some cases, source device 12 and destination device 14 may be equipped for wireless communication.

Destination device 14 may receive the encoded video data to be decoded via a link 16. Link 16 may be any type of medium or device capable of moving the encoded video data from source device 12 to destination device 14. In one example, link 16 may be a communication medium to enable source device 12 to transmit encoded video data directly to destination device 14 in real-time. The encoded video data may be modulated according to a communication standard, such as a wireless communication protocol, and transmitted to destination device 14. The communication medium may include any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

In another example, encoded video data may be output from output interface 22 to a storage device 26. Similarly, encoded video data may be accessed from storage device 26 by input interface 28. Storage device 26 may include any of a variety of distributed or locally accessed data storage media such as a hard drive, Blu-ray™ discs, DVDs, CD-ROMs, flash memory, volatile or non-volatile memory, or any other suitable digital storage media for storing encoded video data. In a further example, storage device 26 may correspond to a file server or another intermediate storage device that may hold the encoded video generated by source device 12. Destination device 14 may access stored video data from storage device 26 via streaming or download. The file server may be any type of server capable of storing encoded video data and transmitting that encoded video data to the destination device 14. Example file servers include a web server (e.g., for a website), a file transfer protocol (FTP) server, network attached storage (NAS) devices, or a local disk drive. Destination device 14 may access the encoded video data through any standard data connection, including an Internet connection. This may include a wireless connection (e.g., a Wi-Fi™ connection), a wired connection (e.g., DSL, cable modem, etc.), or a combination of both that is suitable for accessing encoded video data stored on a file server. The transmission of encoded video data from storage device 26 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, a video encoder 20 and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. In general, capturing video data may include any technique for recording, generating, and/or sensing video data. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 20. The encoded video data may be transmitted directly to destination device 14 via output interface 22 of source device 12. The encoded video data may also (or alternatively) be stored onto storage device 26 for later access by destination device 14 or other devices, for decoding and/or playback.

Destination device 14 includes an input interface 28, a video decoder 30, and a display device 32. In some cases, input interface 28 may include a receiver and/or a modem. Input interface 28 of destination device 14 can receive the encoded video data over link 16. The encoded video data communicated over link 16, or provided on storage device 26, may include a variety of syntax elements generated by video encoder 20 for use by a video decoder, such as video decoder 30, in decoding the video data. Such syntax elements may be included with the encoded video data transmitted on a communication medium, stored on a storage medium, or stored on a file server.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may be any of a variety of display devices such as a liquid crystal display (LCD), a plasma display, an organic light emitting diode (OLED) display, or another type of display device.

Video encoder 20 and video decoder 30 may operate according to a video compression standard, such as HEVC, and may conform to the HEVC Test Model (HM). Video encoder 20 and video decoder 30 may additionally operate according to an HEVC extension, such as the range extension, MV-HEVC, or SHVC which have been developed by the Joint Collaboration Team on Video Coding (JCT-VC) as well as Joint Collaboration Team on 3D Video Coding Extension Development (JCT-3V) of ITU-T Video Coding Experts Group (VCEG) and ISO/IBC Motion Picture Experts Group (MPEG). Alternatively, video encoder 20 and video decoder 30 may operate according to other proprietary or industry standards, such as the ITU-T H.264 standard, alternatively referred to as ISO/IEC MPEG-4, Part 10, Advanced Video Coding (AVC), or extensions of such standards, such as the Scalable Video Coding (SVC) and Multiview Video Coding (MVC) extensions. The techniques of this disclosure, however, are not limited to any particular coding standard. Other examples of video compression standards include ITU-T H.261, ISO/IEC MPEG-1 Visual, ITU-T H.262 or ISO/IEC MPEG-2 Visual, ITU-T H.263, ISO/IEC MPEG-4 Visual, ISO/IEC MPEG-5 Essential Video Coding (EVC) and Low Complexity Enhancement Video Coding.

ITU-T VCEG (Q6/16) and ISO/IEC MPEG (JTC 1/SC 29/WG 11) are now developing future video coding technology with a compression capability that potentially exceeds that of the current HEVC standard (including its current extensions and near-term extensions for screen content coding and high-dynamic-range coding). The new standard is called H.266/VVC (Versatile Video coding). The groups are working together on this exploration activity in a joint collaboration effort known as the Joint Video Exploration Team (JVET) to evaluate compression technology designs. The techniques of this disclosure, however, are not limited to any particular coding standard.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

This disclosure describes techniques related to filtering operations which could be used in a post-processing stage, as part of in-loop coding, or in the prediction stage of video coding. The techniques of this disclosure may be implemented into existing video codecs, such as HEVC, or be an efficient coding tool for a future video coding standard, such as the H.266/VVC standard presently under development.

Video coding typically involves predicting a block of video data from either an already coded block of video data in the same picture (e.g., intra prediction) or an already coded block of video data in a different picture (e.g., inter prediction). In some instances, the video encoder 20 also calculates residual data by comparing the predictive block to the original block. Thus, the residual data represents a difference between the predictive block and the original block.

Video encoder 20 transforms and quantizes the residual data and signals the transformed and quantized residual data in the encoded bitstream. Video decoder 30 adds the residual data to the predictive block to produce a reconstructed video block that matches the original video block more closely than the predictive block alone. To further improve the quality of decoded video, video encoder 20 and video decoder 30 can perform one or more filtering operations on the reconstructed video blocks. Examples of these filtering operations include deblocking filtering, sample adaptive offset (SAO) filtering, and adaptive loop filtering (ALF). As used herein ALF, can refer to the process of adaptive loop filtering and/or the adaptive loop filter itself. Parameters for these filtering operations may be determined by video encoder 20 and explicitly signaled in the encoded video bitstream or may be implicitly determined by video decoder 30 without needing the parameters to be explicitly signaled in the encoded video bitstream.

This disclosure describes techniques related to ALF. An ALF may be used in a post-processing stage, for in-loop coding, or in a prediction process. ALF may be applied to any of various existing video codec technologies, such as HEVC-compliant codec technology, or be an efficient coding tool in any future video coding standards.

As used in this disclosure, the term video coding generically refers to either video encoding or video decoding. Similarly, the term video coder may generically refer to a video encoder or a video decoder. Moreover, certain techniques described in this disclosure with respect to video decoding may also apply to video encoding, and vice versa. For example, often video encoders and video decoders are configured to perform the same process, or reciprocal processes. Also, video encoder 20 may perform video decoding as part of the processes of determining how to encode video data.

As will be explained in more detail below, in accordance with the techniques of this disclosure video encoder 20 and video decoder 30 may be configured to utilize adaptive parameter sets (APSs) to signal information associated with adaptive loop filters (e.g., ALF parameters, such as ALF coefficients). Various techniques are described below for efficiently encoding ALF information and decoding ALF information using APSs, thus improving coding efficiency and/or picture quality.

In HEVC, VVC, and other video coding specifications, a video sequence typically includes a series of pictures. Pictures may also be referred to as "frames." In one example approach, a picture may include three sample arrays, denoted $S_L$, $S_{Cb}$, and $S_{Cr}$. In such an example approach, $S_L$ is a two-dimensional array (i.e., a block) of luma samples. $S_{Cb}$ is a two-dimensional array of Cb chrominance samples. $S_{Cr}$ is a two-dimensional array of Cr chrominance samples. Chrominance samples may also be referred to herein as "chroma" samples. In other instances, a picture may be monochrome and may only include an array of luma samples.

To generate an encoded representation of a picture, video encoder 20 may generate a set of coding tree units (CTUs). In some embodiments, CTUs can be further divided into coding tree blocks (CTBs) (e.g., the two-dimensional arrays of luma, Cb chrominance, and Cr chrominance samples)). In additional embodiments, CTBs can be further divided into coding units (CUs).

In further embodiments, video encoder 20 may additionally or alternatively generate a set of tiles of a picture. A tile may include one or more CTUs of a picture. A tile may define vertical and/or horizontal lines that divide the picture (e.g., into rectangles). The components of a tile (e.g., CTUs) can be decoded in raster scan order inside each tile and the tiles can be decoded in the raster scan order inside a picture. The tiles may affect the availability of the neighboring CTUs, CTBs, or CUs for prediction and may or may not include resetting any entropy coding.

In still further embodiments, video encoder 20 may further segment a tile into slices. In some instances, the slices are designed to be independently decodable, enabling parallel processing.

Each of the CTUs may include a CTB of luma samples, two corresponding CTBs of chroma samples, and syntax structures used to code the samples of the CTBs. In monochrome pictures or pictures having three separate color planes, a CTU may include a single CTB and syntax structures used to code the samples of the CTB. A CTB may be an N×N block of samples. A CTU may also be referred to as a "tree block" or a "largest coding unit" (LCU). The CTUs of HEVC may be broadly analogous to the macroblocks of other standards, such as H.264/AVC. However, a CTU is not necessarily limited to a particular size and may include one or more CUs. A slice may include an integer number of CTUs ordered consecutively in a raster scan order.

In one example, to generate a coded CTU, video encoder 20 may recursively perform quad-tree partitioning on the CTBs of a CTU to divide the CTBs into coding blocks, hence the name "coding tree units." A coding block may be an N×N block of samples. A CU may include a coding block of luma samples and two corresponding coding blocks of chroma samples of a picture that has a luma sample array, a Cb sample array, and a Cr sample array, and syntax structures used to code the samples of the coding blocks. In monochrome pictures or pictures having three separate color planes, a CU may include a single coding block and syntax structures used to code the samples of the coding block.

Video encoder 20 may partition a coding block of a CU into one or more prediction blocks. A prediction block is a rectangular (i.e., square or non-square) block of samples on which the same prediction is applied. A prediction unit (PU) of a CU may include a prediction block of luma samples, two corresponding prediction blocks of chroma samples, and syntax structures used to predict the prediction blocks. In monochrome pictures or pictures having three separate color planes, a PU may include a single prediction block and syntax structures used to predict the prediction block. Video encoder 20 may generate predictive luma, Cb, and Cr blocks for luma, Cb, and Cr prediction blocks of each PU of the CU.

As another example, video encoder 20 and video decoder 30 may be configured to operate according to JEM or VVC. According to JEM or VVC, a video coder (such as video encoder 20) partitions a picture into a coding tree units (CTUs). Video encoder 20 may partition a CTU according to a tree structure, such as a quadtree-binary tree (QTBT) structure or Multi-Type Tree (MTT) structure. The QTBT structure removes the concepts of multiple partition types, such as the separation between CUs, PUs, and TUs (transform units) of HEVC. A QTBT structure includes two levels: a first level partitioned according to quadtree partitioning, and a second level partitioned according to binary tree partitioning. A root node of the QTBT structure corresponds to a CTU. Leaf nodes of the binary trees correspond to coding units (CUs).

In an MTT partitioning structure, blocks may be partitioned using a quadtree (QT) partition, a binary tree (BT) partition, and one or more types of triple tree (TT) partitions. A triple tree partition is a partition where a block is split into three sub-blocks. In some examples, a triple tree partition divides a block into three sub-blocks without dividing the original block through the center. The partitioning types in MTT (e.g., QT, BT, and TT), may be symmetrical or asymmetrical.

In some examples, video encoder 20 and video decoder 30 may use a single QTBT or MTT structure to represent each of the luminance and chrominance components, while in other examples, video encoder 20 and video decoder 30 may use two or more QTBT or MTT structures, such as one QTBT/MTT structure for the luminance component and another QTBT/MTT structure for both chrominance components (or two QTBT/MTT structures for respective chrominance components).

Video encoder 20 and video decoder 30 may be configured to use quadtree partitioning, QTBT partitioning, MTT partitioning, or other partitioning structures.

Video encoder 20 may use intra prediction or inter prediction to generate the predictive blocks for a block (e.g., a PU). If video encoder 20 uses intra prediction to generate the predictive blocks of a PU, video encoder 20 may generate the predictive blocks of the PU based on decoded samples of the picture associated with the PU. If video encoder 20 uses inter prediction to generate the predictive blocks of a PU, video encoder 20 may generate the predictive blocks of the PU based on decoded samples of one or more pictures other than the picture associated with the PU.

Some examples of JEM and VVC also provide an affine motion compensation mode, which may be considered an inter-prediction mode. In affine motion compensation mode, video encoder 20 may determine two or more motion vectors that represent non-translational motion, such as zoom in or out, rotation, perspective motion, or other irregular motion types.

To perform intra-prediction, video encoder 20 may select an intra-prediction mode to generate the prediction block. Some examples of JEM and VVC provide sixty-seven intra-prediction modes, including various directional modes, as well as planar mode and DC mode. In general, video encoder 20 selects an intra-prediction mode that describes neighboring samples to a current block (e.g., a block of a CU) from which to predict samples of the current block. Such samples may generally be above, above and to the left, or to the left of the current block in the same picture as the current block, assuming video encoder 20 codes CTUs and CUs in raster scan order (left to right, top to bottom).

After video encoder 20 generates predictive luma, Cb, and Cr blocks for one or more PUs of a CU, video encoder 20 may generate a luma residual block for the CU. Each sample in the CU's luma residual block indicates a difference between a luma sample in one of the CU's predictive luma blocks and a corresponding sample in the CU's original luma coding block. In addition, video encoder 20 may generate a Cb residual block for the CU. Each sample in the CU's Cb residual block may indicate a difference between a Cb sample in one of the CU's predictive Cb blocks and a corresponding sample in the CU's original Cb coding block. Video encoder 20 may also generate a Cr residual block for the CU. Each sample in the CU's Cr residual block may indicate a difference between a Cr sample in one of the CU's predictive Cr blocks and a corresponding sample in the CU's original Cr coding block.

In some examples, video encoder 20 may use quad-tree partitioning to decompose the luma, Cb, and Cr residual blocks of a CU into one or more luma, Cb, and Cr transform blocks. In other examples, the transform block is the same size as the prediction block. A transform block is a rectangular (e.g., square or non-square) block of samples on which the same transform is applied. A transform unit (TU) of a CU may include a transform block of luma samples, two corresponding transform blocks of chroma samples, and syntax structures used to transform the transform block samples. Thus, each TU of a CU may be associated with a luma transform block, a Cb transform block, and a Cr transform block. The luma transform block associated with the TU may be a sub-block of the CU's luma residual block. The Cb transform block may be a sub-block of the CU's Cb residual block. The Cr transform block may be a sub-block of the CU's Cr residual block. In monochrome pictures or pictures having three separate color planes, a TU may include a single transform block and syntax structures used to transform the samples of the transform block.

Video encoder 20 may apply one or more transforms to a luma transform block of a TU to generate a luma coefficient block for the TU. A coefficient block may be a two-dimensional array of transform coefficients. A transform coefficient may be a scalar quantity. Video encoder 20 may apply one or more transforms to a Cb transform block of a TU to generate a Cb coefficient block for the TU. Video encoder 20 may apply one or more transforms to a Cr transform block of a TU to generate a Cr coefficient block for the TU.

The above block structure with CTUs, CUs, PUs, and TUs generally describes the block structure that can be used in HEVC. Other video coding standards, however, may use different block structures. As one example, although HEVC allows PUs and TUs to have different sizes or shapes, other video coding standards may require predictive blocks and transform blocks to have a same size. The techniques of this disclosure are not limited to the block structure of HEVC or any other standard and may be compatible with other block structures.

After generating a coefficient block (e.g., a luma coefficient block, a Cb coefficient block or a Cr coefficient block), video encoder 20 may quantize the coefficient block. Quantization generally refers to a process in which transform coefficients are quantized to possibly reduce the amount of data used to represent the transform coefficients, providing further compression. After video encoder 20 quantizes a coefficient block, video encoder 20 may entropy encode syntax elements indicating the quantized transform coefficients. For example, video encoder 20 may perform Context-Adaptive Binary Arithmetic Coding (CABAC) on the syntax elements indicating the quantized transform coefficients.

Video encoder 20 may output a bitstream that includes a sequence of bits that forms a representation of coded pictures and associated data. The bitstream may include a sequence of Network Abstraction Layer (NAL) units. A NAL unit is a syntax structure containing an indication of the type of data in the NAL unit and bytes containing that data in the form of a raw byte sequence payload (RBSP) interspersed as necessary with emulation prevention bits. Each of the NAL units includes a NAL unit header and encapsulates a RBSP. The NAL unit header may include a syntax element that indicates a NAL unit type code. The NAL unit type code specified by the NAL unit header of a NAL unit indicates the type of the NAL unit. A RBSP may be a syntax structure containing an integer number of bytes that is encapsulated within a NAL unit. In some instances, an RBSP includes zero bits.

Different types of NAL units may encapsulate different types of RB SP s. For example, a first type of NAL unit may encapsulate an RBSP for a video parameter set (VPS), a second type of NAL unit may encapsulate an RB SP for a sequence parameter set (SPS), a third type of NAL unit may encapsulate an RBSP for a picture parameter set (PPS), a fourth type of NAL unit may encapsulate an RBSP for an adaptive parameter set (APS), a fifth type of NAL unit may encapsulate an RBSP for a coded slice, a sixth type of NAL unit may encapsulate an RBSP for supplemental enhancement information (SEI) messages, and so on. NAL units that encapsulate RBSPs for video coding data (as opposed to RBSPs for parameter sets and SEI messages) may be referred to as video coding layer (VCL) NAL units.

A VPS may include data that is valid across multiple video sequences. An SPS may include data that is valid for an entire video sequence. A PPS may include data that is valid on a picture-by-picture basis. An APS may include picture-adaptive data that is also valid on a picture-by-picture basis but can change more frequently than the data in the PPS.

Video decoder 30 may receive a bitstream generated by video encoder 20. In addition, video decoder 30 may parse the bitstream to obtain syntax elements from the bitstream. Video decoder 30 may reconstruct the pictures of the video data based at least in part on the syntax elements obtained from the bitstream. The process to reconstruct the video data may be generally reciprocal to the process performed by video encoder 20. In addition, video decoder 30 may inverse quantize coefficient blocks associated with TUs of a current CU. Video decoder 30 may perform inverse transforms on the coefficient blocks to reconstruct transform blocks associated with the TUs of the current CU. Video decoder 30 may reconstruct the coding blocks of the current CU by adding the samples of the predictive blocks for PUs of the current CU to corresponding samples of the transform blocks of the TUs of the current CU. By reconstructing the coding blocks for each CU of a picture, video decoder 30 may reconstruct the picture.

Video encoder 20 and video decoder 30 may be configured to implement various adaptive loop filtering techniques set forth in JEM and/or working drafts of VVC. Aspects of some example JEM filtering techniques (e.g., ALF) will now be described. In addition to the modified de-blocking (DB) and HEVC SAO methods, JEM includes another filtering method called Geometry transformation-based Adaptive Loop Filtering (GALF). The input to an ALF/GALF may be the reconstructed image after the application of SAO. Aspects of GALF are described in Tsai, C. Y., Chen, C. Y., Yamakage, T., Chong, I. S., Huang, Y. W., Fu, C. M., Itoh, T., Watanabe, T., Chujoh, T., Karczewicz, M. and Lei, S. M., "Adaptive loop filtering for video coding", IEEE Journal of Selected Topics in Signal Processing, 7(6), pp. 934-945, 2013 and in M. Karczewicz, L. Zhang, W.-J. Chien, and X Li, "Geometry transformation-based adaptive in-loop filter", Picture Coding Symposium (PCS), 2016.

ALF techniques attempt to minimize the mean square error between the original samples and decoded/reconstructed samples by using an adaptive Wiener filter. In some embodiments, ALF can be implemented as described below.

An input image can be denoted as p, a source image as S, and a finite impulse response (FIR) filter as h. The following expression of the sum of squared errors (SSE) can be minimized, where (x, y) denotes any pixel position in p or S.

$$SSE = \Sigma_{x,y}(\Sigma_{i,j} h(i,j) p(x-i, y-j) - S(x,y))^2$$

The optimal h, denoted as $h_{opt}$, can be obtained by setting the partial derivative of SSE with respect to h(i, j) equal to 0 as follows:

$$\frac{\partial SSE}{\partial h(i, j)} = 0$$

This leads to the Wiener-Hopf equation shown below, which gives the optimal filter $h_{opt}$:

$$\Sigma_{i,j} h_{opt}(i,j) (\Sigma_{x,y} p(x-i, y-j) p(x-m, y-n)) = \Sigma_{x,y} S(x,y) p(x-m, y-n)$$

In some examples, instead of using one filter for the whole picture, video encoder 20 and/or video decoder 30 may be configured to classify samples in a picture into twenty-five (25) classes based on the local gradients. Video encoder 20 and/or video decoder 30 may derive separate optimal Wiener filters for the pixels in each class. Several techniques may be used to increase the effectiveness of ALF by reducing signaling overhead and computational complexity. Some of the techniques that can be used to increase ALF effectiveness by reducing signaling overhead and/or computational complexity are listed below:

1. Prediction from fixed filters: Optimal filter coefficients for each class are predicted using a prediction pool of fixed filters which include 16 candidate filters for each class. The best prediction candidate is selected for each class and only the prediction errors are transmitted.
2. Class merging: Instead of using twenty-five (25) different filters (one for each class), pixels in multiple classes can share one filter in order to reduce the number of filter parameters to be coded. Merging two classes can lead to higher cumulative SSE but a lower Rate-Distortion (RD) cost.
3. Variable number of taps: The number of filter taps is adaptive at the frame level. Filters with more taps may achieve lower SSE, but may not be a good choice in terms of RD cost because of the bit overhead associated with more filter coefficients.
4. Block level on/off control: ALF can be turned on and off (enabled or disabled) on a block basis. The block size at which the on/off control flag is signaled is adaptively selected at the frame level. Filter coefficients may be recomputed using pixels from only those blocks for which an ALF is enabled (i.e., an ALF is used).
5. Temporal prediction: Filters derived for previously coded frames are stored in a buffer. If the current frame is a P or B frame, then one of the stored set of filters may be used to filter the current frame if it leads to better RD cost. A flag is signaled to indicate usage of temporal prediction. If temporal prediction is used, then an index indicating which set of stored filters is used is signaled. No additional signaling of ALF coefficients may be needed. Block level ALF on/off control flags may be also signaled for a frame using temporal prediction.

Details of some aspects of ALF are summarized in this and the following paragraphs. Some aspects of ALF are related to pixel classification and geometry transformation. In one example, video encoder 20 and video decoder 30 may be configured to compute sums of absolute values of vertical, horizontal, and diagonal Laplacians at all pixels within a 6×6 window that covers each pixel in a reconstructed frame (before ALF). Video encoder 20 and video decoder 30 divide the reconstructed frame into non-overlapped 2×2 blocks. Video encoder 20 and video decoder 30 classify the four pixels in these blocks into one of twenty five (25) categories, denoted as $C_k$ (k=0, 1, ..., 24), based on the total Laplacian activity and directionality of that block. Additionally, video encoder 20 and video decoder 30 apply one of four geometry transformations (no transformation, diagonal flip, vertical flip, or rotation) to the filters based on the gradient directionality of that block.

Some aspects of adaptive loop filtering are related to filter derivation and prediction from fixed filters. For each class $C_k$, video encoder 20 and video decoder 30 first determine a best prediction filter from the pool for $C_k$, denoted as $h_{pred,k}$, based on the SSE given by the filters. The SSE of $C_k$, which is to be minimized, can be written as below, $$SSE_k = \Sigma_{x,y}(\Sigma_{i,j}(h_{pred,k}(i,j) + h_{\Delta,k}(i,j)) p(x-i, y-j) - S(x,y))^2, k=0,\ldots,24, (x,y) \in C_k,$$

where $h_{\Delta,k}$ is the difference between the optimal filter for $C_k$ and $h_{pred,k}$. $p'(x, y) = \Sigma_{i,j} h_{pred,k}(i, j) p(x-i, y-j)$ is the result of filtering pixel p(x, y) by $h_{pred,k}$. Then the expression for $SSE_k$ can be re-expressed as $$SSE_k = \sum_{x,y} \left( \sum_{i,j} h_{\Delta,k}(i, j) p(x-i, y-j) - (S(x, y) - p'(x, y)) \right)^2$$

$$k = 0, \ldots, 24, (x, y) \in C_k$$

By making the partial derivative of $SSE_k$ with respect to $h_{\Delta,k}(i,j)$ equal to 0, the modified Wiener-Hopf equation can be obtained as follows:

$$\sum_{i,j} h_{\Delta,k}(i, j)\left(\sum_{x,y} p(x-i, y-j)p(x-m, y-n)\right) =$$

$$\sum_{x,y}(S(x, y) - p'(x, y))p(x-m, y-n)$$

$$k = 0, \ldots, 24, (x, y) \in C_k$$

For the simplicity of expression, $\Sigma_{x,y} p(x-i, y-j)p(x-m, y-n)$ and $\Sigma_{x,y}(S(x, y)-p'(x, y))p(x-m, y-n)$ can be denoted with $(x, y) \in C_k$ by $R_{pp,k}(i-m, j-n)$ and $R'_{ps,k}(m, n)$, respectively. Then, the above equation can be expressed as:

$$\Sigma_{i,j} h_{\Delta,k}(i,j) R_{pp,k}(i-m,j-n) = R'_{ps,k}(m,n) \; k=0,\ldots,24 \quad (1)$$

For every $C_k$, the auto-correlation matrix $R_{pp,k}(i-m, j-n)$ and cross-correlation vector $R'_{ps,k}(m, n)$ are computed over all $(x, y) \in C_k$.

In one example of adaptive loop filtering, video encoder 20 calculates and transmits only the difference between the optimal filter and the fixed prediction filter. If none of the candidate filters available in the pool is a good predictor, then video encoder 20 and video decoder 30 uses the identity filter (i.e., the filter with only one non-zero coefficient equal to 1 at the center that makes the input and output identical) as the predictor.

Some aspects of adaptive loop filtering relate to the merging of pixel classes. Classes are merged to reduce the overhead of signaling filter coefficients. The cost of merging two classes is increased with respect to SSE. Two classes $C_m$ and $C_n$ with SSEs given by $SSE_m$ and $SSE_n$, respectively can be determined. $C_{m+n}$ can denote the class obtained by merging $C_m$ and $C_n$ with SSE, $SSE_{m+n}$. $SSE_{m+n}$ can always be greater than or equal to $SSE_m + SSE_n$. $\Delta SSE_{m+n}$ can denote the increase in SSE caused by merging $C_m$ and $C_n$, which is equal to $SSE_{m+n} - (SSE_m + SSE_n)$. To calculate $SSE_{m+n}$, video encoder 20 may derive $h_{\Delta,m+n}$, the filter prediction error for $C_{m+n}$, using the following expression similar to (1):

$$\Sigma_{i,j} h_{\Delta,m+n}(i,j)(R_{pp,m}(i-u,j-v)+R_{pp,n}(i-u,j-v)) = R'_{ps,m}(u,v)+R'_{ps,n}(u,v) \quad (2)$$

Video encoder 20 may calculate the SSE for the merged category $C_{m+n}$ as:

$$SSE_{m+n} = -\Sigma_{u,v} h_{\Delta,m+n}(u,v)(R'_{ps,m}(u,v)+R'_{ps,n}(u,v)) + (R_{ss,m}+R_{ss,n})$$

To reduce the number of classes from N to N−1, two classes, $C_m$ and $C_n$, may be determined, such that merging them leads to the smallest $\Delta SSE_{m+n}$ compared to any other combinations. In some ALF designs, video encoder 20 is configured to check every pair of available classes for merging to find the pair with the smallest merge cost.

If $C_m$ and $C_n$ (with m<n) are merged, then video encoder 20 and video decoder 30 may mark $C_n$ as unavailable for further merging and the auto- and cross-correlations for $C_m$ are changed to the combined auto- and cross-correlations as follows:

$$R_{pp,m} = R_{pp,m} + R_{pp,n}$$

$$R'_{ps,m} = R'_{ps,m} + R'_{ps,n}$$

$$R_{ss,m} = R_{ss,m} + R_{ss,n}.$$

Video encoder 20 may determine an optimal number of ALF classes after merging for each frame based on the RD cost. In one example, this is done by starting with twenty-five (25) classes and merging a pair of classes (from the set of available classes) successively until there is only one class left. For each possible number of classes (1, 2, ..., 25) left after merging, video encoder 20 may store a map indicating which classes are merged together. Video encoder 20 can then select the optimal number of classes such that the RD cost is minimized as follows:

$$N_{opt} = \underset{N}{\operatorname{argmin}}(J|_N = D|_N + \lambda R|_N),$$

where $D|_N$ is the total SSE of using N classes ($D|_N = \Sigma_{k=0}^{N-1} SSE_k$), $R|_N$ is the total number of bits used to code the N filters, and $\lambda$ is the weighting factor determined by the quantization parameter (QP). Video encoder 20 may transmit the merge map for $N_{opt}$ number of classes, indicating which classes are merged together, to video decoder 30.

Aspects of signaling ALF parameters are described below. A brief step-by-step description of an example ALF parameter encoding process performed by video encoder 20 is given below. Video decoder 30 may be configured to perform a reciprocal process (e.g., signal from the perspective of video decoder 30 is the reception of syntax elements).

1. Signal the frame level ALF on/off flag.
2. If ALF is on, then signal the temporal prediction flag indicating the usage of the filters from the previous pictures.
3. If temporal prediction is used, then signal the index of the frame from which the corresponding ALF parameters are used for filtering the current frame.
4. If temporal prediction is not used, then signal the auxiliary ALF information and filter coefficients as follows:
    a. The following auxiliary ALF information may be signaled before signaling the filter coefficients. The auxiliary ALF information may include:
        i. The number of unique filters used after class merging.
        ii. Number of filter taps.
        iii. Class merge information indicating which classes share the filter prediction errors.
        iv. Index of the fixed filter predictor for each class.
    b. After signaling the auxiliary ALF information, filter coefficient prediction errors may be signaled as follows:
        i. A flag is signaled to indicate if the filter prediction errors are forced to zero (0) for some of the remaining classes after merging.
        ii. A flag is signaled to indicate if differential coding is used for signaling filter prediction errors (if the number of classes left after merging is larger than one (1)).
        iii. Filter coefficient prediction errors are then signaled using k-th order Exp-Golomb code, where the k-value for different coefficient positions is selected empirically.
    c. Filter coefficients for chroma components, if available, are directly coded without any prediction methods.
5. Finally, the block-level ALF on/off control flags are signaled.

ALF with Clipping

Described below are examples ALF techniques with clipping that can be performed, for example, by video encoder 20 and/or video decoder 30.

In some embodiments, decoded filter coefficients f(k,l) and clipping values c(k,l) are applied to a reconstructed image R(i,j) as follows:

$$\tilde{R}(i,j) = R(i,j) + \sum_{k,l=(-K,-K),k,l\neq(0,0)}^{K,K} f(k,l)$$
$$* clip3(-c(k,l), c(k,l), R(i+k, j+l) - R(i,j))$$

Figure 2:
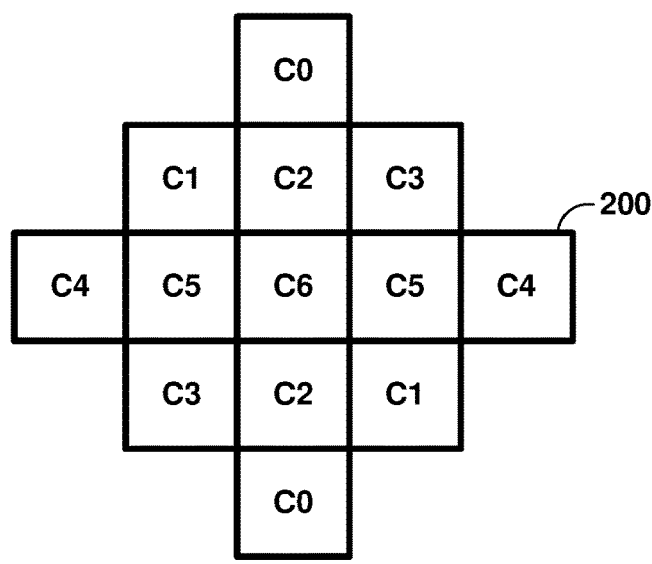
FIG. 2 shows an example of ALF filter supports that can be used with techniques described in this disclosure.
Figure 2:
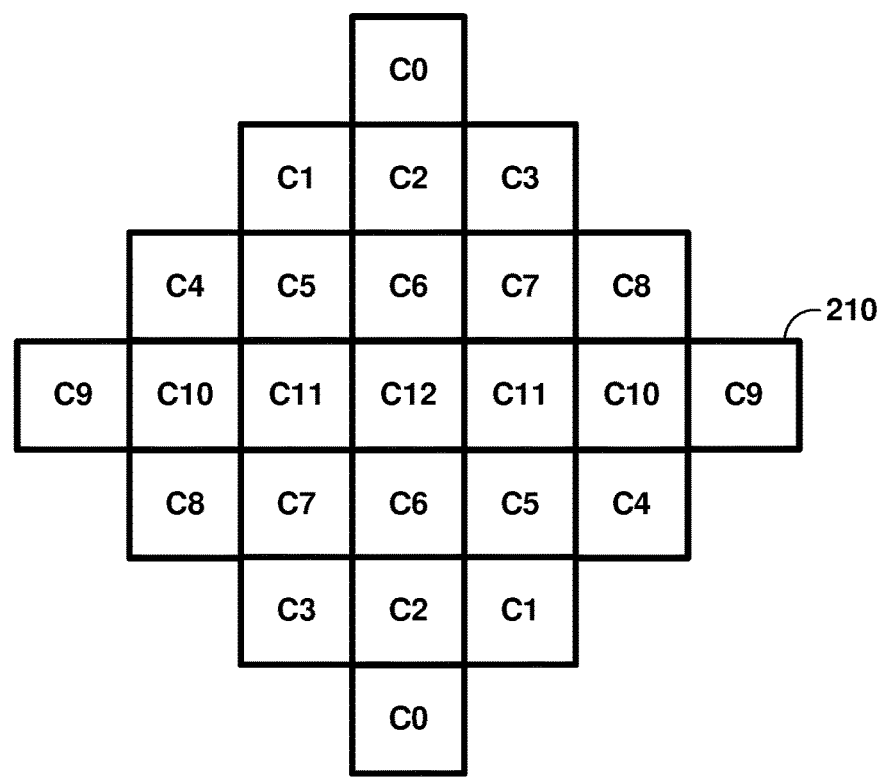

FIG. 2 shows an example of ALF filter supports that can be used with techniques described in this disclosure. In particular, FIG. 2 shows a 5×5 diamond filter support 200 and a 7×7 diamond filter support 210 that can be used with ALF techniques with clipping.

A 7×7 filter (e.g., filter 210) can applied to the luma component and a 5×5 filter (e.g., filter 200) can be applied to chroma components.

Clipping value c(k, l) is calculated as follows. For the luma component:

$$c(k,l) = \text{Round}(2^{(BitDepthY*(4-clipIdx(k,l))/4)})$$

Where BitDepthY is the bit depth for the luma component and clipIdx(k,l) is the clipping values at position (k,l). clipIdx(k,l), which can be 0, 1, 2 or 3.

For the chroma components:

$$c(k,l) = \text{Round}(2^{(BitDepthC-8)} * 2^{(8*(3-clipIdx[k,l])/3)})$$

Where BitDepthC is the bit depth for the chroma component and clipIdx(k,l) is the clipping values at position (k,l). clipIdx(k,l), which can be 0, 1, 2 or 3.

Pixel Classification

For the luma component, 4×4 blocks in the whole picture can be classified based on a 1D Laplacian direction (up to 5 directions) and a 2D Laplacian activity (up to 5 activity values). The direction $Dir_b$ and unquantized activity $Act_b$ can be calculated. $Act_b$ can be further quantized to the range of 0 to 4 inclusively.

Values of two diagonal gradients, in addition to the horizontal and vertical gradients used in the existing ALF, are calculated using the 1-D Laplacian direction. As shown in (3) to (6) below, the sum of gradients of all pixels within an 8×8 window that covers a target pixel is employed as the represented gradient of the target pixel, where R (k, l) is the reconstructed pixels at location (k, l) and indices i and j refer to the coordinates of the upper left pixel in the 4×4 block. Each pixel is associated with four gradient values, with the vertical gradient denoted by $g_v$, the horizontal gradient denoted by $g_h$, the 135 degree diagonal gradient denoted by $g_{d1}$, and the 45 degree diagonal gradient denoted by $g_{d2}$.

$$g_v = \sum_{k=i-2}^{i+5} \sum_{l=j-2}^{j+5} V_{k,l}, \quad (3)$$

$V_{k,l} = |2R(k, l) - R(k, l-1) - R(k, l+1)|$ when both k and l are even numbers or both of k and l are not even numbers, 0 otherwise.

$$g_h = \sum_{k=i-2}^{i+5} \sum_{l=j-2}^{j+5} H_{k,l}, \quad (4)$$

$H_{k,l} = |2R(k, l) - R(k-1, l) - R(k+1, l)|$ when both k and l are even numbers or both of k and l are not even numbers, 0 otherwise.

$$g_{d1} = \sum_{k=i-2}^{i+5} \sum_{l=j-3}^{j+5} D1_{k,l}, \quad (5)$$

$D1_{k,l} = |2R(k, l) - R(k-1, l-1) - R(k+1, l+1)|$ when both k and l are even numbers or both of k and l are not even numbers, 0 otherwise.

$$g_{d2} = \sum_{k=i-2}^{i+5} \sum_{j=j-2}^{j+5} D2_{k,l}, \quad (6)$$

$D2_{k,l} = |2R(k, l) - R(k-1, l+1) - R(k+1, l-1)|$ when both k and l are even numbers or both of k and l are not even numbers, 0 otherwise.

To assign the directionality $Dir_b$, the ratio of the maximum and the minimum of the horizontal and vertical gradients, denoted by $R_{h,v}$ in (7) and the ratio of the maximum and the minimum of two diagonal gradients, denoted by $R_{d1,d2}$ in (8) are compared against each other with two thresholds $t_1$ and $t_2$.

$$R_{h,v} = g_{h,v}^{max} / g_{h,v}^{min}$$

wherein $g_{h,v}^{max} = \max(g_h, g_v), g_{h,v}^{min} = \min(g_h, g_v)$, (7)

$$R_{d0,d1} = g_{d0,d1}^{max} / g_{d0,d1}^{min}$$

wherein $g_{d0,d1}^{max} = \max(g_{d0}, g_{d1}), g_{d0,d1}^{min} = \min(g_{d0}, g_{d1})$ (8)

By comparing the detected ratios of the horizontal/vertical and diagonal gradients, five direction modes, i.e., $Dir_b$ within the range of [0, 4] inclusive, are defined in (9). The values and physical meaning of $Dir_b$ are described in Table 1.

$$D = \begin{cases} 0 & R_{h,v} \leq t_1 \ \&\& R_{d0,d1} \leq t_1 \\ 1 & R_{h,v} > t_1 \ \&\& R_{h,v} > R_{d0,d1} \ \&\& R_{h,v} > t_2 \\ 2 & R_{h,v} > t_1 \ \&\& R_{h,v} > R_{d0,d1} \ \&\& R_{h,v} \leq t_2 \\ 3 & R_{d0,d1} > t_1 \ \&\& R_{h,v} \leq R_{d0,d1} \ \&\& R_{d0,d1} > t_2 \\ 4 & R_{d0,d1} > t_1 \ \&\& R_{h,v} \leq R_{d0,d1} \ \&\& R_{d0,d1} \leq t_2 \end{cases} \quad (9)$$

TABLE 1

Values of Direction and Its Physical Meaning

| Direction values | physical meaning |
| --- | --- |
| 0 | Texture |
| 1 | Strong horizontal/vertical |
| 2 | horizontal/vertical |
| 3 | strong diagonal |
| 4 | diagonal |

The activity value Act can be calculated as:

$$Act = \sum_{k=i-2}^{i+5} \sum_{l=j-2}^{j+5} (V_{k,l} + H_{k,l}). \quad (10)$$

Act is further quantized to the range of 0 to 4 inclusive, and the quantized value is denoted as Â.

Quantization Process from Activity Value Act to Activity Index Â

The quantization process can be defined as follows:

avg_var=Clip_post(NUM_ENTRY-1,
(Act*ScaleFactor)>>shift);

Â=ActivityToIndex[avg_var]

wherein NUM_ENTRY is set to 16, ScaleFactor is set to 64, shift is (4+internal coded-bitdepth), ActivityToIndex[NUM_ENTRY]={0, 1, 2, 2, 2, 2, 2, 3, 3, 3, 3, 3, 3, 3, 3, 4}, and function Clip_post(a, b) returns the smaller value between a and b.

In total, each 4×4 luma block can be categorized into one out of 25 (5×5) classes and an index is assigned to each 4×4 block according the value of $Dir_b$ and $Act_b$ of the block. The group index can be denoted by C and is set equal to $5Dir_b + Â$ wherein Â is the quantized value of $Act_b$.

Geometry Transformations

For each category, one set of filter coefficients and clipping values may be signalled. To better distinguish different directions of blocks marked with the same category index, four geometry transformations, including no transformation, diagonal, vertical flip and rotation, are introduced.

Figure 3:
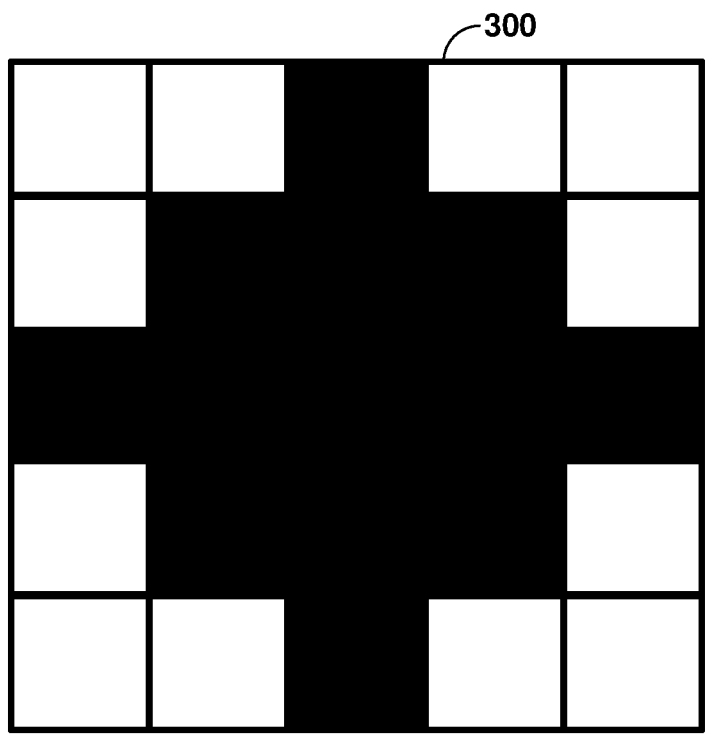
FIG. 3 shows an example of an ALF filter support that can be used with techniques described in this disclosure.

FIG. 3 shows an example of an ALF filter support that can be used with techniques described in this disclosure. In particular, FIG. 3 shows a 5×5 diamond-shaped filter support 300.

Figure 4:
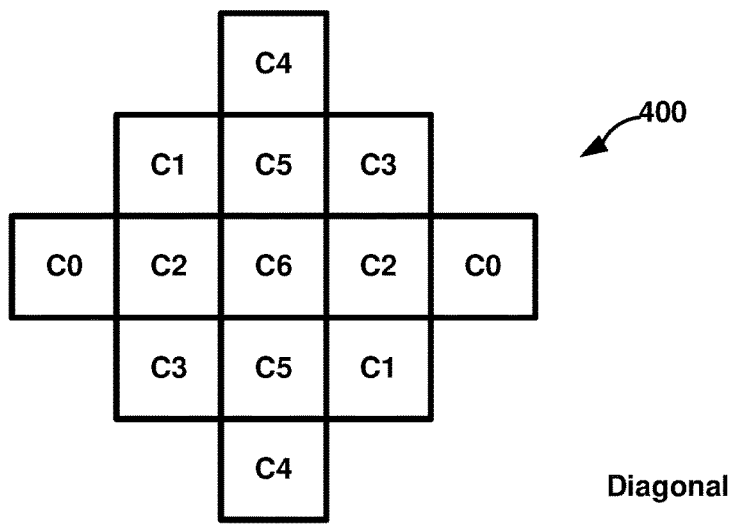
FIG. 4 shows examples of geometry transformations that can be used with techniques described in this disclosure.
Figure 4:
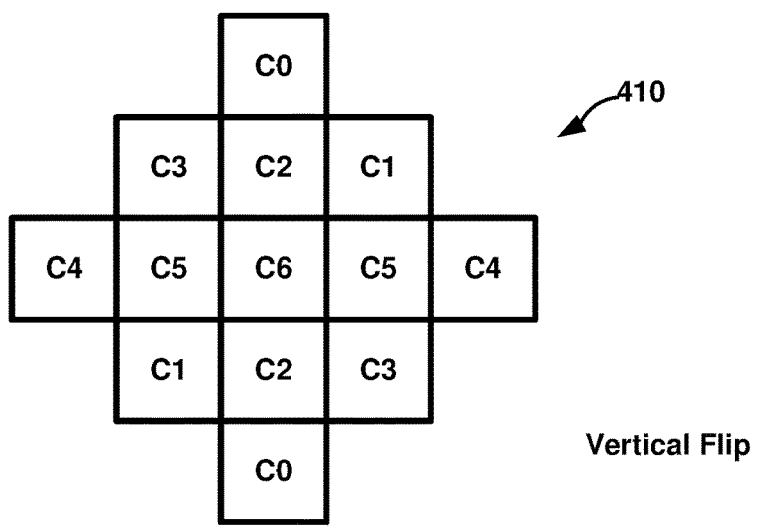
Figure 4:
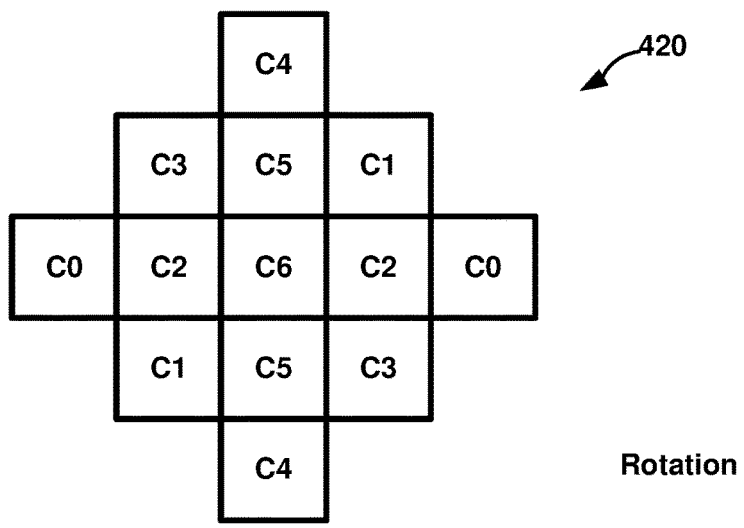

FIG. 4 shows examples of geometry transformations that can be used with techniques described in this disclosure. In particular, FIG. 4 can show geometry transformations 400, 410, and 420. In some embodiments, the geometry transformations 400, 410, and 420 can be geometry transformations of the filter support 300 shown in FIG. 3. In further embodiments, the geometry transformation 400 can be a diagonal transform of the filter support 300, the geometry transformation 410 can be a vertical flip transform of the filter support 300, and the geometry transformation 420 can be a rotation transform of the filter support 400.

The geometric transformations shown in FIG. 3 and FIG. 4 can be represented in formula forms as follows:

Diagonal: $f_D(k,l)=f(l,k), c_D(k,l)=c(l,k)$,

Vertical flip: $f_V(k,l)=f(k,K-l-1), c_V(k,l)=c(k,K-l-1)$

Rotation: $f_R(k,l)=f(K-l-1,k), c_R(k,l)=c(K-l-1,k)$. (11)

where K is the size of the filter and $0 \leq k$, $l \leq K-1$ are coefficients coordinates, such that location (0,0) is at the upper left corner and location (K-1, K-1) is at the lower right corner.

In embodiments when the diamond filter support is used, the coefficients with coordinates out of the filter support will be set to 0. In some embodiments, the geometry transformation index can be indicated by deriving it implicitly to avoid additional overhead. In GALF, the transformations are applied to the filter coefficients f(k, l) depending on gradient values calculated for that block. The relationship between the transformation and the four gradients calculated using (3)-(6) is described in Table 2. To summarize, the transformations are based on which one of two gradients (horizontal and vertical, or 45 degree and 135 degree gradients) is larger. Based on the comparison, more accurate direction information can be extracted. Therefore, different filtering results could be obtained due to the transformation while the overhead of filter coefficients is not increased.

TABLE 2

Mapping of Gradient and Transformations.

| Gradient values | Transformation |
| --- | --- |
| $g_{d2} < g_{d1}$ and $g_h < g_v$ | No transformation |
| $g_{d2} < g_{d1}$ and $g_v < g_h$ | Diagonal |
| $g_{d1} < g_{d2}$ and $g_h < g_v$ | Vertical flip |
| $g_{d1} < g_{d2}$ and $g_v < g_h$ | Rotation |

Filter Information Signaling

In some embodiments, one luma filter parameter set can contain filter information (including filter coefficients and clipping values) for all 25 classes.

Fixed filters can be used to predict the filters for each class. A flag can be signaled for each class to indicate whether this class uses a fixed filter as its filter predictor. If yes, the fixed filter information is signaled.

To reduce the number of bits required to represent the filter coefficients, different classes can be merged. The information indicating which classes are merged is provided by sending an index $i_C$ for each of the 25 classes. Classes having the same index $i_C$ share the same filter coefficients that are coded. The mapping between classes and filters is signaled for each luma filter set. The index $i_C$ is coded with a truncated binary binarization method.

A signaled filter can be predicted from a previously signaled filter.

Adaptive Parameter Set

Adaptive parameter sets (APSs) can be used to carry ALF filter coefficients in the bitstream. An APS can contain a set of luma filter parameters or a set(s) of chroma filter parameters, or a combination thereof. A tile group (i.e., a group of one or more tiles) may only signal indices of APSs that are used for the current tile group in its tile group header. APSs can be used in various video coding standards, such as VVC.

CTU/CTB-Based Filter Set Switch

Filters generated from previously coded tile groups can be used for the current tile group to save the overhead for filter signaling. A luma CTU/CTB can use a filter set among fixed filter sets and non-fixed filter sets from an APSs. The filter set index can be signaled. All chroma CTBs may use a filter from the same APS. In the tile group header, the APSs used for luma and chroma CTBs of the current tile group can be signaled.

This disclosure describes techniques to further improve the coding gains and visual quality obtained by using adaptive loop filtering. Video encoder 20 and/or video decoder 30 may apply any of the following itemized techniques individually. Alternatively, video encoder 20 and/or video decoder 30 may apply any combination of the techniques discussed below.

In some embodiments, a filter (e.g., an ALF) for a current block signaled in one APS may be predicted from other filters in the same APS, filters in different APSs, or pre-defined filters. For instance, a filter for one tile/slice of a picture can be predicted based on a filter for a previous tile/slice in the same picture, a filter for a previous tile/slice in a different picture, or a set of pre-defined filters (e.g., maintained by a decoder and/or signalled from the encoder to the decoder for one or more video sequences). The video encoder 20 can indicate that the filter is to be predicted in the APS, can indicate which filter to use for the prediction, can indicate which APS to use to obtain the filter parameters used for prediction, and/or indicate the difference between the filter parameters for the current block and the filter parameters used for the prediction in the APS (if any). Based on the indications and filter parameters in the APS received from the video encoder 20, the video decoder can determine the filter for the current block.

In further embodiments, filter parameters generated for one picture/slice/tile-group can be included in a single APS or can be included in multiple APSs. In some embodiments, an index can be signaled to indicate which APS(s) contain the filter parameters for a picture/slice/tile-group. This can result in reduced signaling as the filter parameters do not need to be signaled for each picture/slice/tile-group and can be, for example, consolidated in one APS or a group of APSs.

In other embodiments, all or some of the filters signaled in the same APS can use the same signaling parameter(s) to apply exponential-Golomb codes to signal filter coefficients. Additionally or alternatively, all or some of the filters signaled in the same APS can use the same signaling parameters to apply exponential-Golomb codes for the coefficients in the same positions of these filters. This can result in coding efficiencies due to allowing use of different order exponential-Golomb codes. For example, the order can be signaled for all or some of the filters and/or a default value can be used (e.g., if no order is signaled, a default flag is enabled, etc.).

In some embodiments, each filter may have its own parameters to apply exponential-Golomb codes to signal filter coefficients. In one example, all coefficients in a filter use the same parameters of exponential-Golomb codes. In another example, the parameters of exponential-Golomb codes can depend on the position of the coefficients in the filter. For example, for each filter, for each coefficient, or for each position, the order for the exponential-Golomb codes can be signaled or can be a default value (e.g., if no order is signaled, a default flag is enabled, etc.). This can result in coding efficiencies due to allowing use of different order exponential-Golomb codes for each filter, coefficient, position, etc.

In further embodiments, 0th order exponential-Golomb codes may be used to signal filter coefficients.

In additional embodiments, filter information (such as an APS index, a filter set index, and/or a filter index) of previously coded CTBs/CTUs/blocks, such as the filter information of a neighbor CTB/CTU/block, may be used to predict the filter information for current CTB/CTU/block. In some embodiments, the prediction may be used only when a number of filter candidates is larger than a threshold. For example, the threshold can be 100 and prediction may be used when the number of filter candidates is greater than 100. In further embodiments, the prediction information and filter information may be signaled with or without contexts. Example contexts include whether a neighboring block uses the same filter, whether a neighboring block used prediction, whether ALF is enabled/disabled for a neighboring block, and the like.

In some embodiments, an APS index can be predicted (inferred) from top and/or left neighboring CTBs/CTUs/blocks. In some embodiments, predicting the APS index from the top and/or left neighboring CTBs/CTUs/blocks can be the defined default behavior. In other embodiments, a flag can be used to indicate that the APS index is to be predicted from the top and/or left neighboring CTBs/CTUs/blocks.

In other embodiments, contexts used for signaling APS indices may be derived based on the APS indices signaled for neighboring CTBs/CTUs/blocks (located at the top and left of the current CTB/CTU/block). In other words, the APS indices signaled for neighboring CTBs/CTUs/blocks can be used as prediction information.

In further embodiments, for a CTB, instead of re-using filters in the APSs, some coefficient differences may be signaled, then the coefficients of the final filters may be equal to the sum of coefficients of filters in the APSs and the coefficient difference.

In additional embodiments, filters from coded APSs may be used to form one or multiple new filters. In some implementations, only the information about where the filters are from is signaled and, thus, the signal filter coefficients may not be signaled. For example, a new APS may be signaled in the bitstream, with an indication to obtain one or more filter parameters from a first APS and one or more filter parameters from a second APS that were previous signaled. As a further example, the new APS may be signaled with one or more filter parameters and may also include an indication to obtain one or more filter parameters from previously signalled APSs. Additionally or alternatively, information about how new filter sets are formed may be signaled in picture/slice/tile group headers, such that the new filter sets can be used in that picture/slice/tile group. An example of such information can be an indicator (e.g., an index) of an APS and/or an indicator (e.g., an index) of a filter within the APS.

Figure 5:
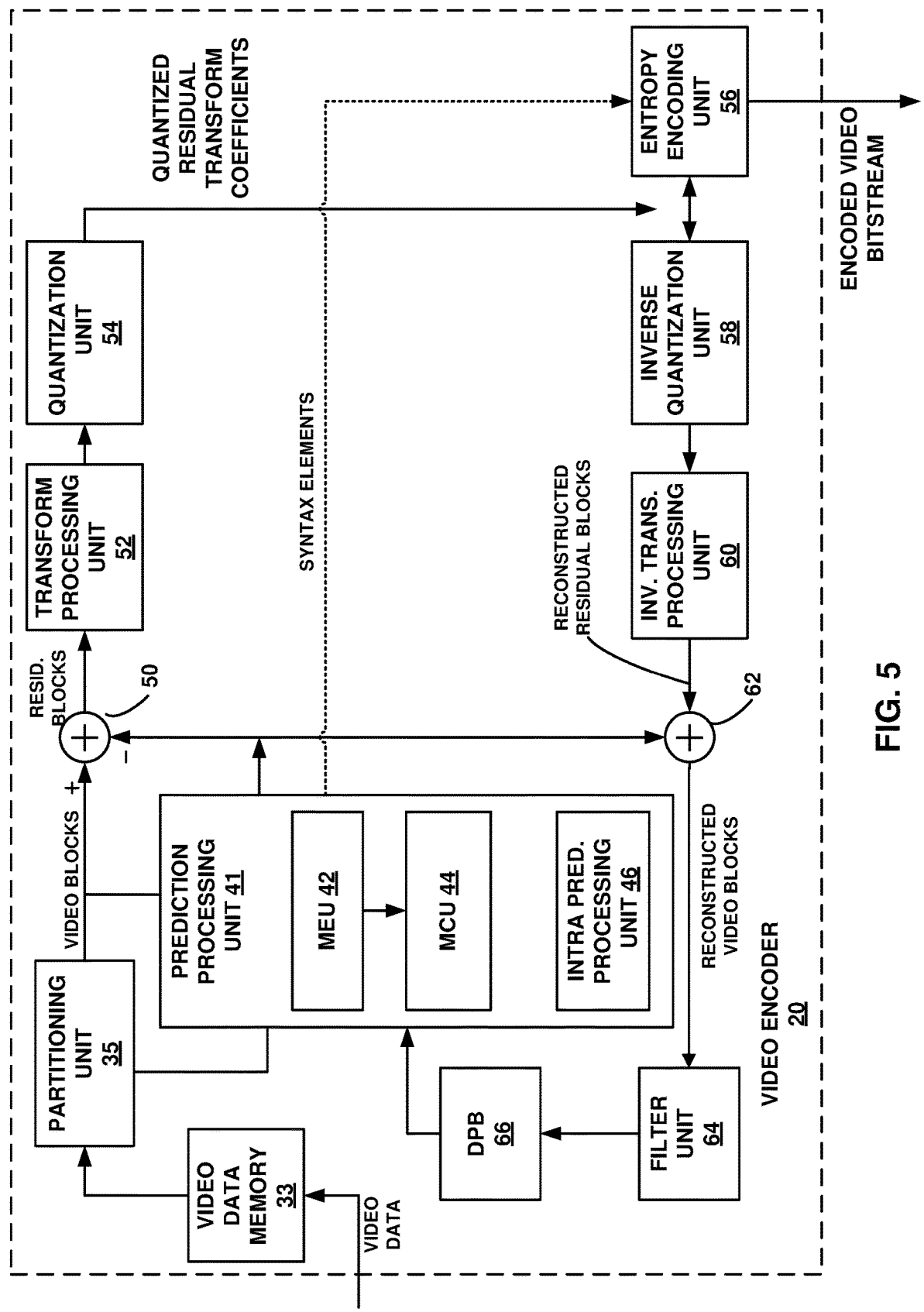
FIG. 5 is a block diagram illustrating an example video encoder that may implement the techniques described in this disclosure.

FIG. 5 is a block diagram illustrating an example video encoder 20 that may implement the techniques described in this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial-based compression modes. Inter-modes, such as uni-directional prediction (P mode) or bi-prediction (B mode), may refer to any of several temporal-based compression modes.

In the example of FIG. 5, video encoder 20 includes a video data memory 33, partitioning unit 35, prediction processing unit 41, summer 50, transform processing unit 52, quantization unit 54, entropy encoding unit 56. Prediction processing unit 41 includes motion estimation unit (MEU) 42, motion compensation unit (MCU) 44, and intra prediction unit 46. For video block reconstruction, video encoder 20 also includes inverse quantization unit 58, inverse transform processing unit 60, summer 62, filter unit 64, and decoded picture buffer (DPB) 66.

As shown in FIG. 5, video encoder 20 receives video data and stores the received video data in video data memory 33. Video data memory 33 may store video data to be encoded by the components of video encoder 20. The video data stored in video data memory 33 may be obtained, for example, from video source 18. DPB 66 may be a reference picture memory that stores reference video data for use in encoding video data by video encoder 20, e.g., in intra- or inter-coding modes. Video data memory 33 and DPB 66 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 33 and DPB 66 may be provided by the same memory device or separate memory devices. In various examples, video data memory 33 may be on-chip with other components of video encoder 20, or off-chip relative to those components.

Partitioning unit 35 retrieves the video data from video data memory 33 and partitions the video data into video blocks. This partitioning may also include partitioning into slices, tiles, or other larger units, as wells as video block partitioning, e.g., according to a quadtree structure of LCUs and CUs. Video encoder 20 generally illustrates the components that encode video blocks within a video slice to be encoded. The slice may be divided into multiple video blocks (and possibly into sets of video blocks referred to as tiles). Prediction processing unit 41 may select one of multiple possible coding modes, such as one of multiple intra coding modes or one of multiple inter coding modes, for the current video block based on error results (e.g., coding rate and the level of distortion). Prediction processing unit 41 may provide the resulting intra- or inter-coded block to summer 50 to generate residual block data and to summer 62 to reconstruct the encoded block for use as a reference picture.

Intra prediction unit 46 within prediction processing unit 41 may perform intra-predictive coding of the current video block relative to one or more neighboring blocks in the same frame or slice as the current block to be coded to provide spatial compression. Motion estimation unit 42 and motion compensation unit 44 within prediction processing unit 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as P slices or B slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in DPB 66. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in DPB 66. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

After prediction processing unit 41 generates the predictive block for the current video block, either via intra prediction or inter prediction, video encoder 20 forms a residual video block by subtracting the predictive block from the current video block. The residual video data in the residual block may be included in one or more TUs and applied to transform processing unit 52. Transform processing unit 52 transforms the residual video data into residual transform coefficients using a transform, such as a discrete cosine transform (DCT) or a conceptually similar transform. Transform processing unit 52 may convert the residual video data from a pixel domain to a transform domain, such as a frequency domain.

Transform processing unit 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a quantization parameter. In some examples, quantization unit 54 may then perform a scan of the matrix including the quantized transform coefficients. In another example, entropy encoding unit 56 may perform the scan.

Following quantization, entropy encoding unit 56 entropy encodes the quantized transform coefficients. For example, entropy encoding unit 56 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy encoding methodology or technique. Following the entropy encoding by entropy encoding unit 56, the encoded bitstream may be transmitted to video decoder 30 or archived for later transmission or retrieval by video decoder 30. Entropy encoding unit 56 may also entropy encode the motion vectors and the other syntax elements for the current video slice being coded provided by prediction processing unit 41. Further, entropy encoding unit 56 may also entropy encode VPS, SPS, PPS, and/or APS information. For example, the entropy encoding unit 56 may encode APS information that indicates that a filter for a current block is to be predicted based on information in a previous APS, as described above.

Inverse quantization unit 58 and inverse transform processing unit 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reconstructed block.

Filter unit 64 filters the reconstructed block (e.g. the output of summer 62) and stores the filtered reconstructed block in DPB 66 for uses as a reference block. The reference block may be used by motion estimation unit 42 and motion compensation unit 44 as a reference block to inter-predict a block in a subsequent video frame or picture. Filter unit 64 may perform any type of filtering such as deblock filtering, SAO filtering, peak SAO filtering, ALF, and/or GALF, and/or other types of loop filters. A deblock filter may, for example, apply deblocking filtering to filter block boundaries to remove blockiness artifacts from reconstructed video. A peak SAO filter may apply offsets to reconstructed pixel values in order to improve overall coding quality. Additional loop filters (in loop or post loop) may also be used.

In addition, filter unit 64 may be configured to perform any of the techniques in this disclosure related to adaptive loop filtering. For example, as described above, filter unit 64 may be configured to determine parameters for filtering a current block based on parameters for filtering a previous block that were included in the same APS as the current block, a different APS, or pre-defined filters.

Figure 6:
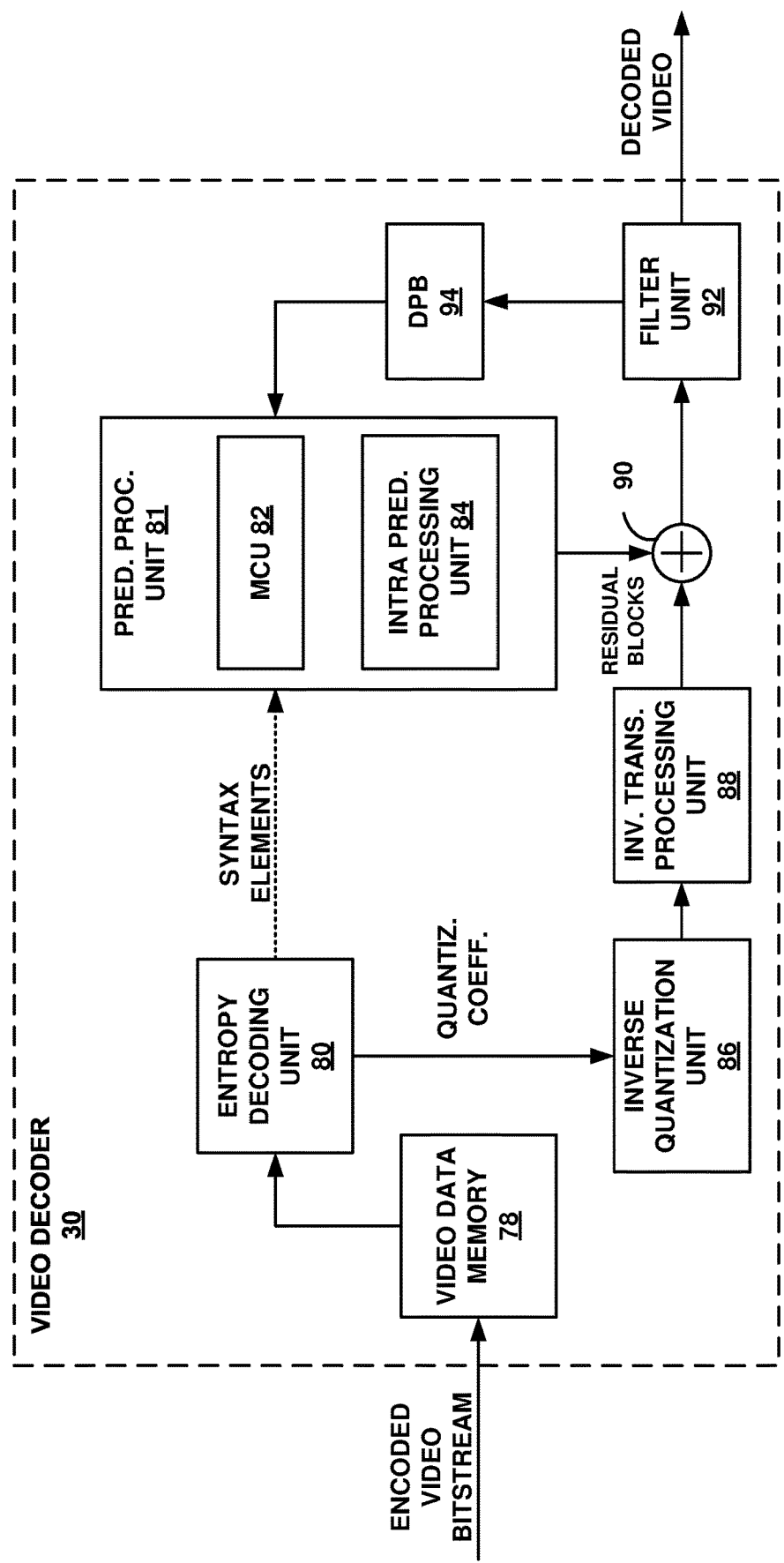
FIG. 6 is a block diagram illustrating an example video decoder that may implement the techniques described in this disclosure.

FIG. 6 is a block diagram illustrating an example video decoder 30 that may implement the techniques described in this disclosure. Video decoder 30 of FIG. 6 may, for example, be configured to receive the signaling described above with respect to video encoder 20 of FIG. 5. In the example of FIG. 6, video decoder 30 includes video data memory 78, entropy decoding unit 80, prediction processing unit 81, inverse quantization unit 86, inverse transform processing unit 88, summer 90, DPB 94, and filter unit 92. Prediction processing unit 81 includes motion compensation unit 82 and intra prediction unit 84. Video decoder 30 may, in some examples, perform a decoding pass generally reciprocal to the encoding pass described with respect to video encoder 20 from FIG. 5.

During the decoding process, video decoder 30 receives an encoded video bitstream that represents video blocks of an encoded video slice and associated syntax elements from video encoder 20. Video decoder 30 stores the received encoded video bitstream in video data memory 78. Video data memory 78 may store video data, such as an encoded video bitstream, to be decoded by the components of video decoder 30. The video data stored in video data memory 78 may be obtained, for example, via link 16, from storage device 26, or from a local video source, such as a camera, or by accessing physical data storage media. Video data memory 78 may form a coded picture buffer (CPB) that stores encoded video data from an encoded video bitstream. DPB 94 may be a reference picture memory that stores reference video data for use in decoding video data by video decoder 30, e.g., in intra- or inter-coding modes. Video data memory 78 and DPB 94 may be formed by any of a variety of memory devices, such as DRAM, SDRAM, MRAM, RRAM, or other types of memory devices. Video data memory 78 and DPB 94 may be provided by the same memory device or separate memory devices. In various examples, video data memory 78 may be on-chip with other components of video decoder 30, or off-chip relative to those components.

Entropy decoding unit 80 of video decoder 30 entropy decodes the video data stored in video data memory 78 to generate quantized coefficients, motion vectors, and other syntax elements. Entropy decoding unit 80 forwards the motion vectors and other syntax elements to prediction processing unit 81. Video decoder 30 may receive the syntax elements at the video slice level and/or the video block level. Entropy decoding unit 80 may also decode VPS, SPS, PPS, and/or APS information. For example, the entropy decoding unit 80 may decode APS information that indicates that a filter for a current block is to be predicted based on information in a previous APS, as described above.

When the video slice is coded as an intra-coded (I) slice, intra prediction unit 84 of prediction processing unit 81 may generate prediction data for a video block of the current video slice based on a signaled intra prediction mode and data from previously decoded blocks of the current frame or picture. When the video frame is coded as an inter-coded slice (e.g., B slice or P slice), motion compensation unit 82 of prediction processing unit 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in DPB 94.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice or P slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform processing unit 88 applies an inverse transform, e.g., an inverse DCT, an inverse integer transform, or a conceptually similar inverse transform process, to the transform coefficients in order to produce residual blocks in the pixel domain.

After prediction processing unit 81 generates the predictive block for the current video block using, for example, intra or inter prediction, video decoder 30 forms a reconstructed video block by summing the residual blocks from inverse transform processing unit 88 with the corresponding predictive blocks generated by motion compensation unit 82. Summer 90 represents the component or components that perform this summation operation.

Filter unit 92 filters the reconstructed block (e.g. the output of summer 90) and stores the filtered reconstructed block in DPB 94 for uses as a reference block and/or outputs the filtered reconstructed block (decoded video). The reference block may be used by motion compensation unit 82 as a reference block to inter-predict a block in a subsequent video frame or picture. Filter unit 92 may perform any type of filtering such as deblock filtering, SAO filtering, peak SAO filtering, ALF, and/or GALF, and/or other types of loop filters. A deblock filter may, for example, apply deblocking filtering to filter block boundaries to remove blockiness artifacts from reconstructed video. A peak SAO filter may apply offsets to reconstructed pixel values in order to improve overall coding quality. Additional loop filters (in loop or post loop) may also be used.

In addition, filter unit 92 may be configured to perform any of the techniques in this disclosure related to adaptive loop filtering. For example, as described above, filter unit 92 may be configured to determine parameters for filtering a current block based on parameters for filtering a previous block that were included in the same APS as the current block, a different APS, or pre-defined filters.

Figure 7:
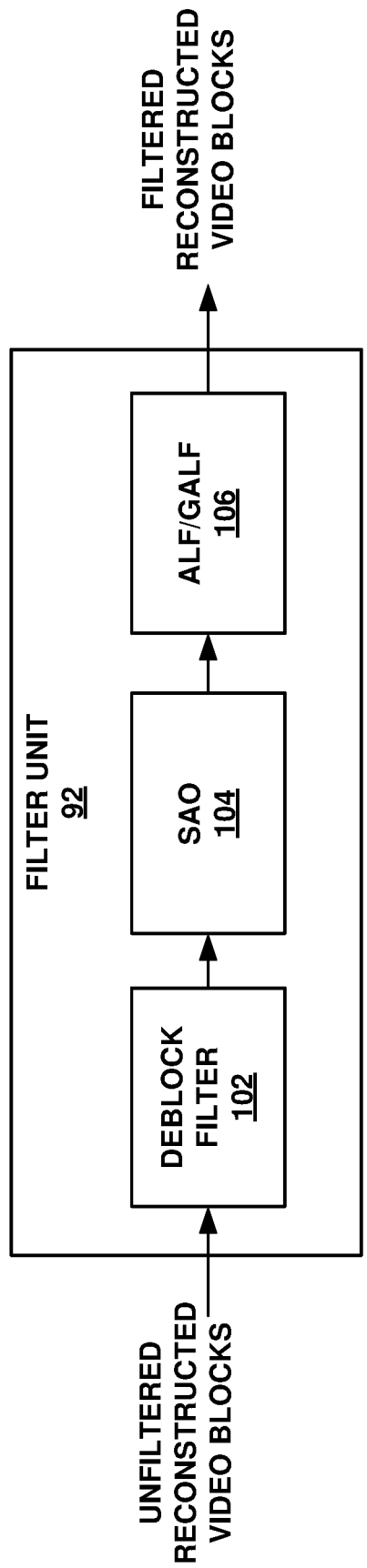
FIG. 7 shows an example implementation of a filter unit for performing the techniques of this disclosure.

FIG. 7 shows an example implementation of filter unit 92. Filter unit 64 may be implemented in the same manner. Filter units 64 and 92 may perform the techniques of this disclosure, possibly in conjunction with other components of video encoder 20 or video decoder 30. In other embodiments, the filter unit 64 can be a post-processing unit that can perform the techniques of this disclosure outside of, for example, the video decoder 30 (e.g., after the decoded video is output from the video decoder 30). In the example of FIG. 7, filter unit 92 includes deblock filter 102, SAO filter 104, and ALF/GALF filter 106. SAO filter 104 may, for example, be configured to determine offset values for samples of a block in the manner described in this disclosure. ALF/GALF filter 106 may be configured to, for example, determine parameters for filtering a current block based on parameters for filtering a previous block that were included in the same APS as the current block, a different APS, or pre-defined filters.

Filter unit 92 may include fewer filters and/or may include additional filters. Additionally, the particular filters shown in FIG. 7 may be implemented in a different order. Other loop filters (either in the coding loop or after the coding loop) may also be used to smooth pixel transitions or otherwise improve the video quality. When in the coding loop, the decoded video blocks in a given frame or picture are then stored in DPB 94, which stores reference pictures used for subsequent motion compensation. DPB 94 may be part of or separate from additional memory that stores decoded video for later presentation on a display device, such as display device 32 of FIG. 1.

Figure 8:
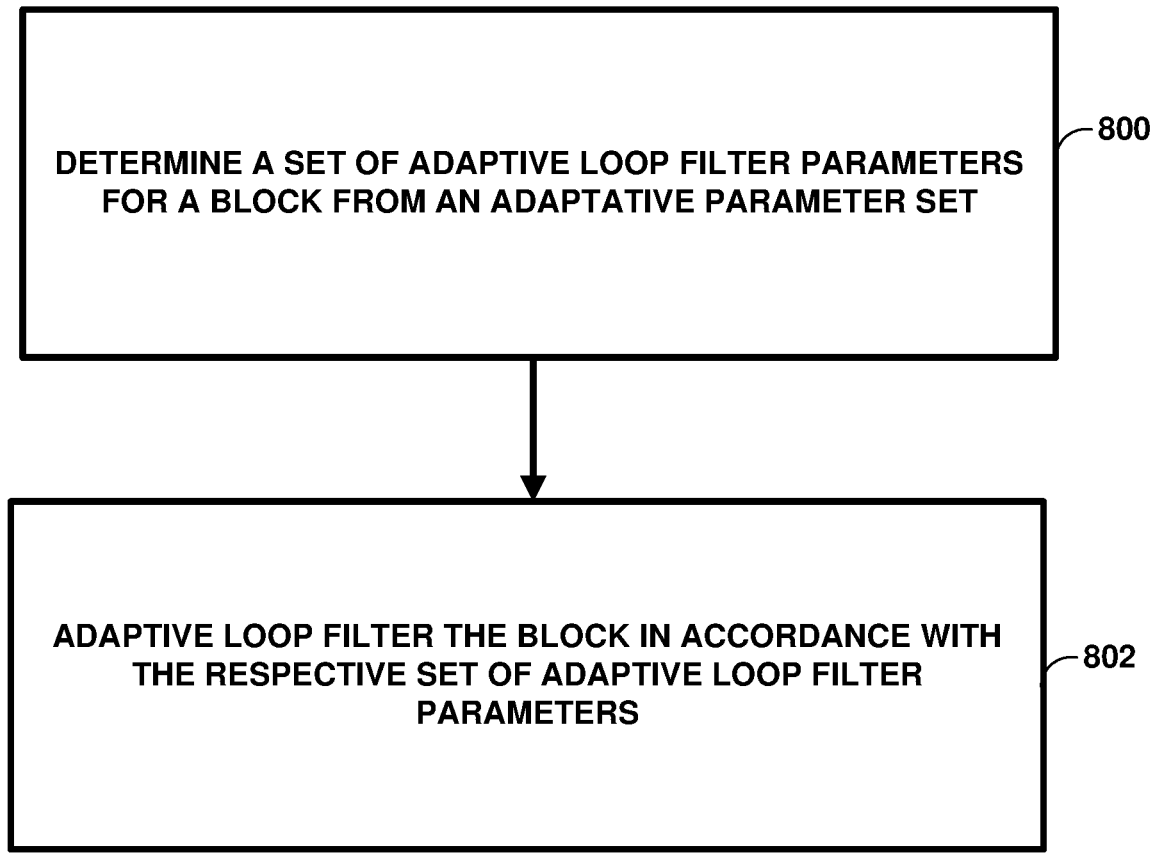
FIG. 8 is a flowchart illustrating an example method of the disclosure.

FIG. 8 is a flowchart illustrating an example method of the disclosure. The techniques of FIG. 8 may be performed by one or more structural units of video encoder 20 and video decoder 30, including filter unit 64 and filter unit 92. As discussed above, the term "coding" generically refers to both encoding and decoding. Likewise, the term "code" generically refers to both encode and decode.

In one example of the disclosure, video encoder 20 and/or video decoder 30 may, in element 800, determine a set of ALF parameters for a block from an APS.

For example, as described above, ALF parameters for the current block may be predicted from other filters in the same APS, filters in different APSs, or pre-defined filters.

As an additional example, ALF parameters generated for one picture/slice/tile-group are included in a single APS or multiple APSs.

As an additional example, all or some of the filters signaled in the same APS can use the same parameters (orders) to apply exponential-Golomb codes to signal filter coefficients.

As an additional example, all or some of the filters signaled in the same APS can use the same parameters (orders) to apply exponential-Golomb codes to signal filter coefficients for the coefficients in the same filter positions.

As an additional example, in an APS, each filter may have its own parameters (orders) to apply exponential-Golomb codes to signal filter coefficients.

As an additional example, 0th order exponential-Golomb codes may be used to signal coefficients in a filter explicitly or implicitly.

As an additional example, the filter information (such as an APS index, an adaptive loop filter set index, and/or an adaptive filter index) of previously coded CTBs/CTUs/blocks, such as the filter information of a neighbor CTB/CTU/block, may be used to predict the filter information for current CTB/CTU/block. The prediction may be used only when a number of adaptive loop filter/APS candidates is larger than a threshold. The prediction information and filter information may be signaled with or without contexts.

As an additional example, the APS index of current CTB/CTU/block can be predicted (inferred) from top and/or left neighboring CTBs/CTUs/blocks.

As an additional example, the contexts used for signaling APS indices may be derived based on the APS indices signaled for neighboring CTBs/CTUs/blocks (located at the top and left of the current CTB/CTU/block).

As an additional example, for a CTB, instead of re-using filters in the APSs, some coefficient differences may be signaled, then the coefficients of the final filters may be equal to the sum of coefficients of filters in the APSs and the coefficient difference.

As an additional example, the filters from coded APSs may be used to form one or multiple new APSs. For example, only the information about where the filters are from (APS index and/or filter index) is signaled and, thus, the filter coefficients in the new APSs may not be signaled.

As an additional example, information about how new filter sets are formed (APS index and/or filter index) may be signaled in picture/slice/tile group headers, such that the new filter sets can be used in that picture/slice/tile group.

In element 802, the video encoder and/or the video decoder 30 may adaptive loop filter the block in accordance with the respective set of adaptive loop filter parameters determined in the element 800.

Figure 9:
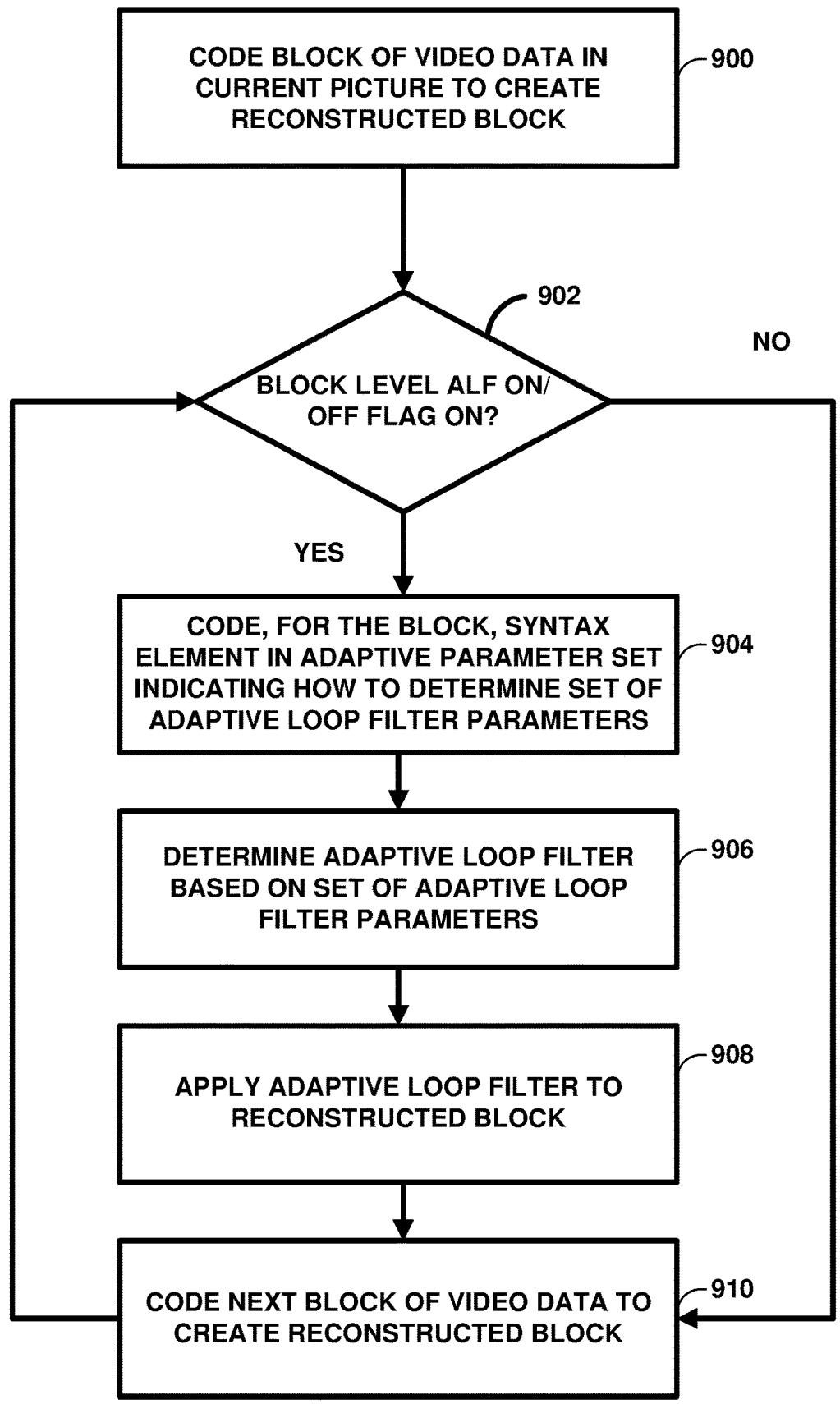
FIG. 9 is a flowchart illustrating another example method of the disclosure.

FIG. 9 is a flowchart illustrating another example method of the disclosure. FIG. 9 shows an example of the techniques of FIG. 8 in more detail. For example, video encoder 20 and/or video decoder 30 may, in element 900, code a block of video data in a current picture to create a reconstructed block of video data. That is, video encoder 20 and/or video decoder 30 may code the first block of video data in the current picture to create a first reconstructed block of video data.

Video encoder 20 and/or video decoder 30 may then, in element 902, determine if a block level ALF On/Off flag is on. If no, video encoder 20 and/or video decoder 30 do not apply ALF, and instead proceed to code the next block of video data in element 910. If yes, in element 904, video encoder 20 and/or video decoder 30 code, for the block, a syntax element in an adaptive parameter set that indicates how to determine a set of ALF parameters.

In element 906, video encoder 20 and/or video decoder 30 may then determine the ALF parameters based on the syntax element coded in element 904 (e.g., predicted based on parameters for previous ALFs in the APS or a different APS). In element 908, video encoder 20 and/or video decoder 30 may then apply the adaptive loop filter (i.e., the ALF parameters determined in block 906) to the reconstructed block. In element 910, video encoder 20 and/or video decoder 30 may then proceed to code the next block of video data. For example, the next block of video data may be a second block of video data. The process of FIG. 9 is then repeated.

Figure 10:
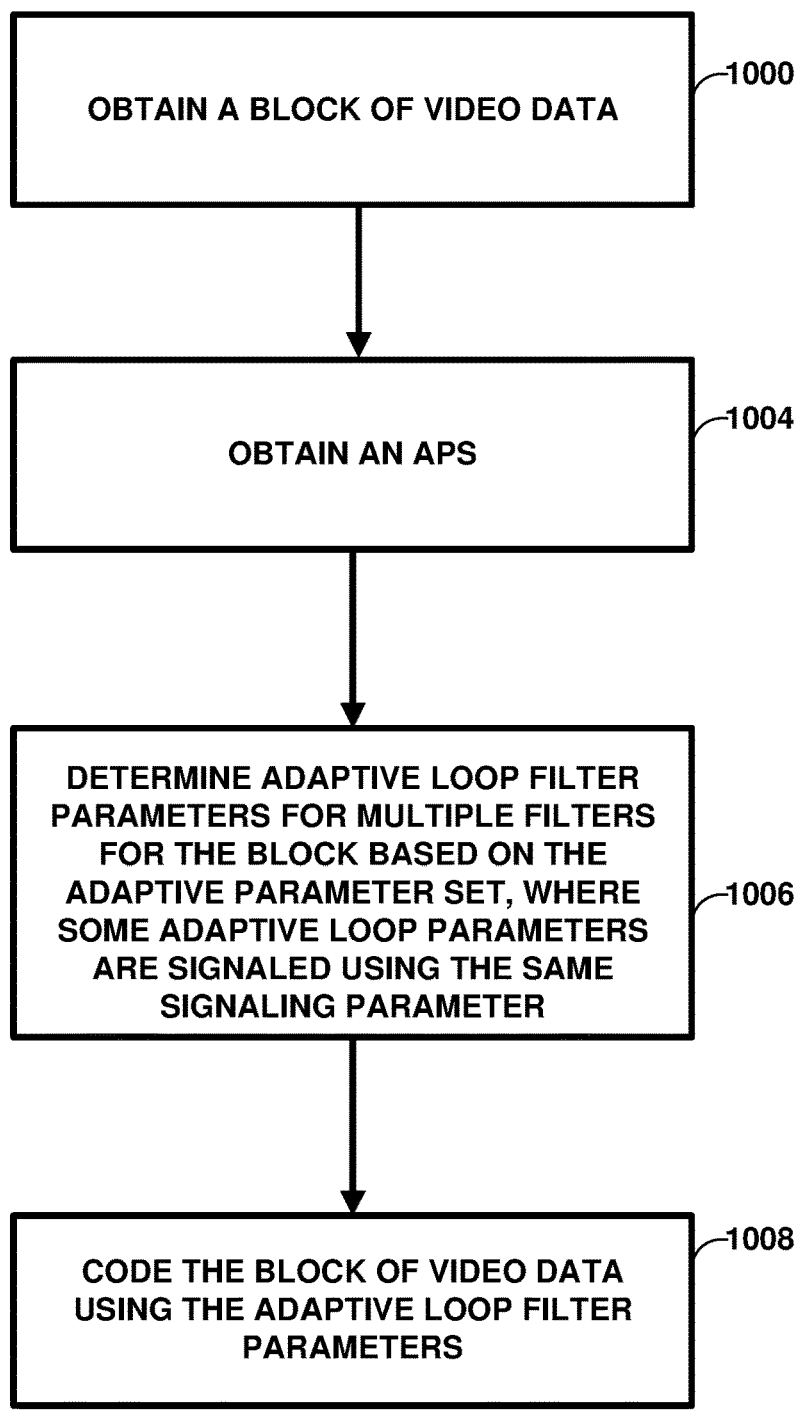
FIG. 10 is a flowchart illustrating another example method of the disclosure.

FIG. 10 is a flowchart illustrating another example method of the disclosure. FIG. 10 shows an example of the techniques of FIG. 8 in more detail. For example, video encoder 20 and/or video decoder 30 may, in element 1000, obtain a block of video data.

In element 1004, video encoder 20 and/or video decoder 30 may obtain an adaptive parameter set (APS) and, in element 1006, determine a set of adaptive loop filter parameters for multiple filters for the block of video data based on the adaptive parameter set. Multiple adaptive loop parameters of the set of adaptive loop filter parameters may be signaled using the same signaling parameter for each of the multiple of filters of the adaptive parameter set.

In element 1008, the video encoder 20 and/or video decoder 30 may code the block of video data using the set of adaptive loop filter parameters.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to tangible media such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can be any of RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

The previous description of the disclosed examples is provided to enable a person skilled in the art to make or use the disclosed examples. Various modifications to these examples will readily apparent to those skilled in the art, and the principles defined herein may be applied to other examples without departing from the scope of the disclosure. Thus, the present disclosure is not intended to be limited to the examples shown herein but is to be accorded the widest scope possible consistent with the principles and novel features as defined by the following claims.

What is claimed is:

1. A device for coding video data, the device comprising:
a memory configured to store the video data; and
one or more processors configured to:
obtain a block of video data;
obtain an adaptive parameter set;
determine a set of adaptive loop filter parameters for a plurality of filters for the block of video data based on the adaptive parameter set, wherein a plurality of adaptive loop filter parameters of the set of adaptive loop filter parameters are signaled using a same signaling parameter for each of the plurality of filters of the adaptive parameter set, and the plurality of filters comprises all filters signaled in the adaptive parameter set;
code the block of video data using the set of adaptive loop filter parameters;
obtain a second adaptive parameter set, wherein signaling of the second adaptive parameter set includes an indication of one or more adaptive loop filter parameters in the set of adaptive loop filter parameters;
obtain a second block of video data;
determine that a number of adaptive loop filter candidates is larger than a threshold;
based on the number of adaptive loop filter candidates being larger than the threshold, predict a second set of adaptive loop filter parameters based on the set of adaptive loop filter parameters; and code the second block of video data using the second set of adaptive loop filter parameters.

2. The device according to claim 1, wherein the plurality of adaptive loop filter parameters comprises filter coefficients that are signaled using the same signaling parameter for each of the plurality of filters.

3. The device according to claim 1, wherein the plurality of adaptive loop filter parameters comprises filter coefficient positions that are signaled using the same signaling parameter for each of the plurality of filters.

4. The device according to claim 1, wherein the same signaling parameter comprises an exponential-Golomb code order.

5. The device according to claim 4, wherein the exponential-Golomb code order is a $0^{th}$ order.

6. The device according to claim 4, wherein the exponential-Golomb code order is signaled.

7. The device according to claim 4, wherein the exponential-Golomb code order is a default value.

8. The device according to claim 7, wherein the exponential-Golomb code order is determined to be the default value based on a flag.

9. The device according to claim 7, wherein the exponential-Golomb code order is determined to be the default value based on an order not being signaled.

10. A method for coding video data, the method comprising:

obtaining a block of video data;
obtaining an adaptive parameter set;
determining, using a processor, a set of adaptive loop filter parameters for a plurality of filters for the block of video data based on the adaptive parameter set, wherein a plurality of adaptive loop filter parameters of the set of adaptive loop filter parameters are signaled using a same signaling parameter for each of the plurality of filters of the adaptive parameter set, and the plurality of filters comprises all filters signaled in the adaptive parameter set;
coding the block of video data using the set of adaptive loop filter parameters;
obtaining a second adaptive parameter set, wherein signaling of the second adaptive parameter set includes an indication of one or more adaptive loop filter parameters in the set of adaptive loop filter parameters;
obtaining a second block of video data;
determining that a number of adaptive loop filter candidates is larger than a threshold;
based on the number of adaptive loop filter candidates being larger than the threshold, predicting a second set of adaptive loop filter parameters based on the set of adaptive loop filter parameters; and
coding the second block of video data using the second set of adaptive loop filter parameters.

11. The method according to claim 10, wherein the plurality of adaptive loop filter parameters comprises filter coefficients that are signaled using the same signaling parameter for each of the plurality of filters.

12. The method according to claim 10, wherein the plurality of adaptive loop filter parameters comprises filter coefficient positions that are signaled using the same signaling parameter for each of the plurality of filters.

13. The method according to claim 10, wherein the same signaling parameter comprises an exponential-Golomb code order.

14. The method according to claim 13, wherein the exponential-Golomb code order is a $0^{th}$ order.

15. The method according to claim 13, wherein the exponential-Golomb code order is signaled.

16. The method according to claim 13, wherein the exponential-Golomb code order is a default value.

17. The method according to claim 16, wherein the exponential-Golomb code order is determined to be the default value based on a flag.

18. The method according to claim 16, wherein the exponential-Golomb code order is determined to be the default value based on an order not being signaled.

19. A non-transitory computer-readable medium for coding video data, the non-transitory computer-readable medium storing a program containing instructions that, when executed by a processor of a device, cause the device to perform a method comprising:

obtaining a block of video data;
obtaining an adaptive parameter set;
determining a set of adaptive loop filter parameters for a plurality of filters for the block of video data based on the adaptive parameter set, wherein a plurality of adaptive loop filter parameters of the set of adaptive loop filter parameters are signaled using a same signaling parameter for each of the plurality of filters of the adaptive parameter set, and the plurality of filters comprises all filters signaled in the adaptive parameter set;
coding the block of video data using the set of adaptive loop filter parameters; and
obtaining a second adaptive parameter set, wherein signaling of the second adaptive parameter set includes an indication of one or more adaptive loop filter parameters in the set of adaptive loop filter parameters;
obtain a second block of video data;
determine that a number of adaptive loop filter candidates is larger than a threshold;
based on the number of adaptive loop filter candidates being larger than the threshold, predict a second set of adaptive loop filter parameters based on the set of adaptive loop filter parameters; and
code the second block of video data using the second set of adaptive loop filter parameters.

* * * * *